US011609669B2

(12) United States Patent
Na et al.

(10) Patent No.: US 11,609,669 B2
(45) Date of Patent: Mar. 21, 2023

(54) ELECTRONIC DEVICE

(71) Applicant: Samsung Display Co., Ltd., Yongin-Si (KR)

(72) Inventors: Hye-Seok Na, Hwaseong-si (KR); Younggu Kang, Cheonan-si (KR); Hyun-Sung Park, Hwaseong-si (KR); Dongjin Seo, Hwaseong-si (KR); Yu Deok Seo, Suwon-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/582,859

(22) Filed: Jan. 24, 2022

(65) Prior Publication Data
US 2022/0334676 A1    Oct. 20, 2022

(30) Foreign Application Priority Data

Apr. 16, 2021   (KR) .................... 10-2021-0049584

(51) Int. Cl.
  *G06F 3/044*  (2006.01)
  *H01L 27/32*  (2006.01)
  *H01L 51/52*  (2006.01)
(52) U.S. Cl.
  CPC .......... *G06F 3/0445* (2019.05); *G06F 3/0448* (2019.05); *H01L 27/323* (2013.01);
  (Continued)
(58) Field of Classification Search
  CPC ...... G06F 3/0448; G06F 3/044; G06F 3/0445; G06F 3/0446; G06F 3/0412;
  (Continued)

(56) References Cited

U.S. PATENT DOCUMENTS 8,947,370 B2   2/2015   An et al.
10,572,086 B2   2/2020   Na et al.
(Continued)

FOREIGN PATENT DOCUMENTS

CN   113900537 A   1/2022
CN   113934258 A   1/2022
(Continued)

*Primary Examiner* — Dennis P Joseph
(74) *Attorney, Agent, or Firm* — Innovation Counsel LLP

(57) ABSTRACT

An electronic device includes a display layer, a sensor layer disposed on the display layer and including a first sensing pattern and a second sensing pattern spaced apart from the first sensing pattern. The first sensing pattern includes a first-first group including a first-first pattern and a first-second pattern spaced apart from the first-first pattern in a first oblique direction, a first-second group including a first-third pattern and a first-fourth pattern spaced apart from the first-third pattern in a second oblique direction crossing the first oblique direction. The second sensing pattern includes a second-first group adjacent to the first-first group and including a second-first pattern and a second-second pattern spaced apart from the second-first pattern in the second oblique direction and a second-second group including a second-third pattern and a second-fourth pattern spaced apart from the second-third pattern with the second-first group interposed therebetween in the first oblique direction.

20 Claims, 19 Drawing Sheets

(52) U.S. Cl.
CPC ...... *H01L 27/3244* (2013.01); *H01L 51/5253* (2013.01); *G06F 2203/04111* (2013.01); *G06F 2203/04112* (2013.01)

(58) Field of Classification Search
CPC ......... G06F 3/0443; G06F 2203/04106; G06F 2203/04111; G06F 2203/04112
See application file for complete search history.

(56) References Cited

U.S. PATENT DOCUMENTS

| | | | |
|---|---|---|---|
| 2014/0293153 A1* | 10/2014 | Wang | G06F 3/0445 349/12 |
| 2017/0108975 A1* | 4/2017 | Zhang | G06F 3/0446 |
| 2018/0224964 A1* | 8/2018 | Church | G06F 3/047 |
| 2018/0348932 A1* | 12/2018 | Lee | G06F 3/0443 |
| 2019/0064960 A1* | 2/2019 | Na | G06F 3/0412 |
| 2021/0397298 A1 | 12/2021 | Choi et al. | |
| 2022/0020824 A1 | 1/2022 | Na et al. | |
| 2022/0357816 A1* | 11/2022 | Wen | G09G 3/035 |

FOREIGN PATENT DOCUMENTS

| | | |
|---|---|---|
| EP | 3929709 A1 | 12/2021 |
| KR | 10-1726623 B1 | 4/2017 |
| KR | 10-2019-0025096 A | 3/2019 |
| KR | 10-2020-0109644 A | 9/2020 |
| KR | 10-2021-0157944 A | 12/2021 |
| KR | 10-2022-0008997 A | 1/2022 |

\* cited by examiner

ELECTRONIC DEVICE

CROSS-REFERENCE TO RELATED APPLICATION

This U.S. non-provisional patent application claims priority under 35 U.S.C. § 119 of Korean Patent Application No. 10-2021-0049584, filed on Apr. 16, 2021, the contents of which are hereby incorporated by reference in its entirety.

BACKGROUND

1. Field of Disclosure

The present disclosure generally relates to an electronic device. More particularly, the present disclosure relates to an electronic device including a sensor layer with improved sensing sensitivity.

2. Description of the Related Art

Electronic devices include a display layer displaying an image and a sensor layer sensing an external input. The sensor layer includes a plurality of electrodes. In recent years, as electronic devices having active areas with a variety of shapes are being developed, wearable electronic devices also include the sensor layer to sense the external input.

SUMMARY

The present disclosure provides an electronic device including a sensor layer with improved strength and sensing sensitivity.

Embodiments of the present disclosure provide an electronic device including a display layer and a sensor layer disposed on the display layer and including a first sensing pattern and a second sensing pattern spaced apart from the first sensing pattern. The first sensing pattern includes a first-first group including a first-first pattern and a first-second pattern spaced apart from the first-first pattern in a first oblique direction, a first-second group including a first-third pattern and a first-fourth pattern spaced apart from the first-third pattern with respect to the first-first group interposed therebetween in a second oblique direction crossing the first oblique direction. The second sensing pattern includes a second-first group adjacent to the first-first group and including a second-first pattern and a second-second pattern spaced apart from the second-first pattern in the second oblique direction and a second-second group including a second-third pattern and a second-fourth pattern spaced apart from the second-third pattern with respect to the second-first group interposed therebetween in the first oblique direction.

The first sensing pattern includes a first-third group including a first-fifth pattern and a first-sixth pattern spaced apart from the first-fifth pattern with respect to the second-second group interposed therebetween in the first oblique direction, and the second sensing pattern includes a second-third group including a second-fifth pattern and a second-sixth pattern spaced apart from the second-fifth pattern with respect to the first-second group interposed therebetween in the second oblique direction.

The first sensing pattern includes a first-fourth group including a first-seventh pattern and a first-eighth pattern spaced apart from the first-seventh pattern with respect to the second-third group interposed therebetween in the second oblique direction, and the second sensing pattern includes a second-fourth group including a second-seventh pattern and a second-eighth pattern spaced apart from the second-seventh pattern with respect to the first-third group interposed therebetween in the first oblique direction.

The first-third pattern, the first-fourth pattern, the second-fifth pattern, and the second-sixth pattern extend in the first oblique direction, and the second-third pattern, the second-fourth pattern, the first-fifth pattern, and the first-sixth pattern extend in the second oblique direction.

The electronic device further includes extension patterns disposed between patterns of the first sensing pattern and between patterns of the second sensing pattern.

The extension patterns of the first sensing pattern are alternately arranged with and spaced apart from the extension patterns of the second sensing pattern along a clockwise direction.

The electronic device further includes a dummy pattern disposed between the patterns of the first sensing pattern and between the patterns of the second sensing pattern.

The first sensing pattern includes a first bridge pattern disposed between the first-first pattern and the first-second pattern and integrally formed with the first-first pattern and the first-second pattern.

The second sensing pattern includes a second bridge pattern disposed between the second-first pattern and the second-second pattern and disposed on a layer different from a layer on which the first bridge pattern is disposed.

The sensor layer includes a first sensing insulating layer disposed on the display layer, a first conductive layer disposed on the first sensing insulating layer and disposed in a the non-light-emitting area, a second sensing insulating layer disposed on the first sensing insulating layer and covering the first conductive layer, and a second conductive layer disposed on the second sensing insulating layer and disposed in the non-light-emitting area, the first conductive layer includes the second bridge pattern, and the second conductive layer includes the other patterns except the second bridge pattern among the first sensing pattern and the second sensing pattern.

The second bridge pattern is connected to the second-first pattern and the second-second pattern via contact holes defined through the second sensing insulating layer.

The first sensing pattern and the second sensing pattern include a plurality of mesh lines extending in the first and second oblique directions and defining a mesh opening.

Each of the first-first pattern, the first-second pattern, the second-first pattern, and the second-second pattern has an area smaller than combined areas of the first-second group and the second-second group.

An area in which the first-first group and the second-first group are disposed has a lozenge shape, and the first-second group and the second-second group surround the lozenge shape.

The first-first pattern, the second-second pattern, the first-second pattern, and the second-first pattern are sequentially arranged in a clockwise direction, the first-third pattern faces the second-second pattern, the first-fourth pattern faces the second-first pattern, the second-third pattern faces the first-first pattern, and the second-fourth pattern faces the first-second pattern.

The display layer includes a base layer, a circuit layer disposed on the base layer and including a transistor, a light emitting element layer including a light emitting element connected to the transistor, and an encapsulation layer covering the light emitting element, and the sensor layer is disposed directly on the encapsulation layer.

The display layer includes a base layer, a circuit layer disposed on the base layer and including a transistor, a light emitting element layer including a light emitting element connected to the transistor, an encapsulation substrate disposed on the light emitting element layer, and a coupling member disposed at an edge of the encapsulation substrate to attach the circuit layer to the encapsulation substrate, and the sensor layer is disposed on the encapsulation substrate.

Embodiments of the present disclosure provide an electronic device including a first-first group including a first-first pattern and a first-second pattern spaced apart from the first-first pattern in a first oblique direction, a first-second group including a first-third pattern and a first-fourth pattern spaced apart from the first-third pattern with the first-first group interposed therebetween in a second oblique direction crossing the first oblique direction, a second-first group including a second-first pattern and a second-second pattern spaced apart from the second-first pattern in the second oblique direction, and a second-second group including a second-third pattern and a second-fourth pattern spaced apart from the second-third pattern in the first oblique direction. The first-first pattern, the second-second pattern, the first-second pattern, and the second-first pattern are sequentially arranged in a clockwise direction, the first-third pattern faces the second-second pattern, the first-fourth pattern faces the second-first pattern, the second-third pattern faces the first-first pattern, and the second-fourth pattern faces the first-second pattern.

The electronic device further includes extension patterns disposed between patterns of the first sensing pattern and between patterns of the second sensing pattern.

The electronic device further includes a dummy pattern disposed between the patterns of the first sensing pattern and between the patterns of the second sensing pattern.

According to the above, even though the input by the active pen is provided with a tilted angle, the capacitance is uniformly provided regardless of areas to which the input by the active pen is provided. Thus, the sensor layer of the electronic device has improved linearity.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
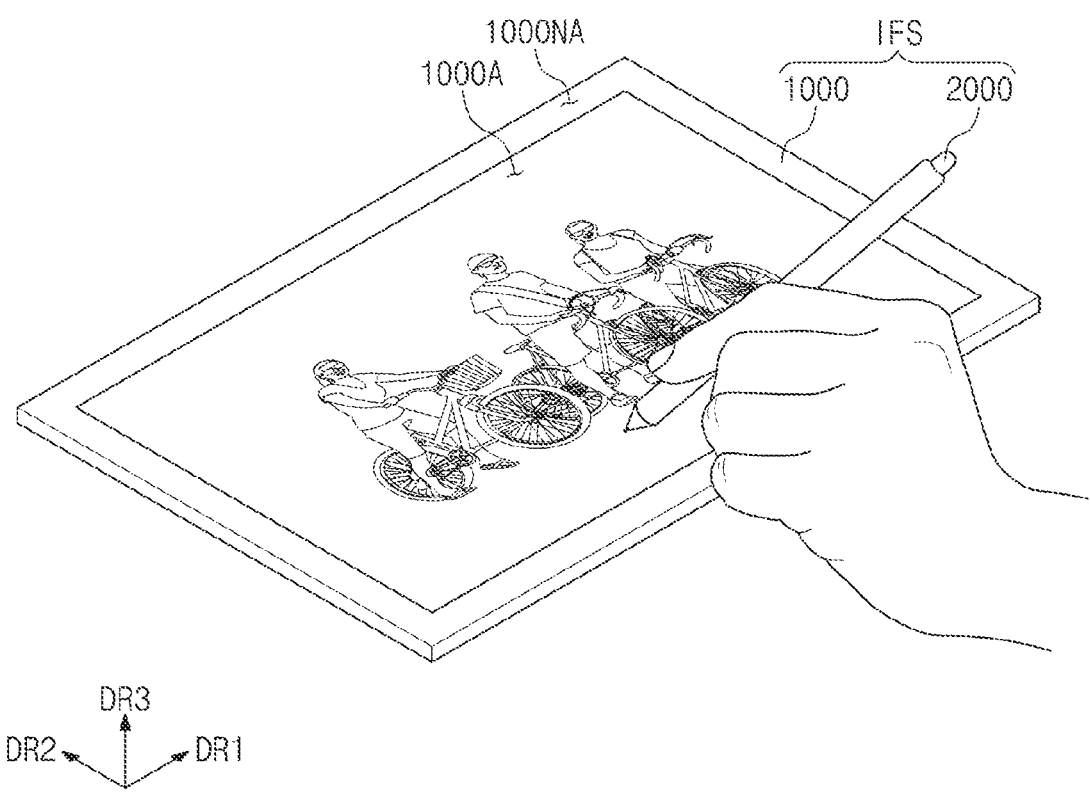
FIG. 1 is a perspective view showing an interface device according to an embodiment of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as shown in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, the present disclosure will be explained in detail with reference to the accompanying drawings.

FIG. 1 is a perspective view showing an interface device IFS according to an embodiment of the present disclosure.

Referring to FIG. 1, the interface device IFS may include an electronic device 1000 and an input device 2000. The electronic device 1000 may sense an input generated by the input device 2000. In the present disclosure, the electronic device 1000 and the input device 2000 may be referred to as the interface device IFS. The interface device IFS may be referred to as an electronic system, a touch system, an input/output system, a pen tablet, or a pen terminal.

The electronic device 1000 may be a device that is activated in response to electrical signals. For example, the electronic device 1000 may be a mobile phone, a foldable mobile phone, a tablet computer, a car navigation unit, a game unit, or a wearable device, however, it should not be limited thereto or thereby. In FIG. 1, a tablet computer is shown as a representative example of the electronic device 1000.

The electronic device 1000 may include an active area 1000A and a peripheral area 1000NA, which are defined therein. The electronic device 1000 may display an image through the active area 1000A. The active area 1000A may include a plane defined by a first direction DR1 and a second direction DR2. The peripheral area 1000NA may surround the active area 1000A.

A thickness direction of the electronic device 1000 may be substantially parallel to a third direction DR3 crossing the first direction DR1 and the second direction DR2. Accordingly, front (or upper) and rear (or lower) surfaces of each member of the electronic device 1000 may be defined with respect to the third direction DR3.

Figure 2:
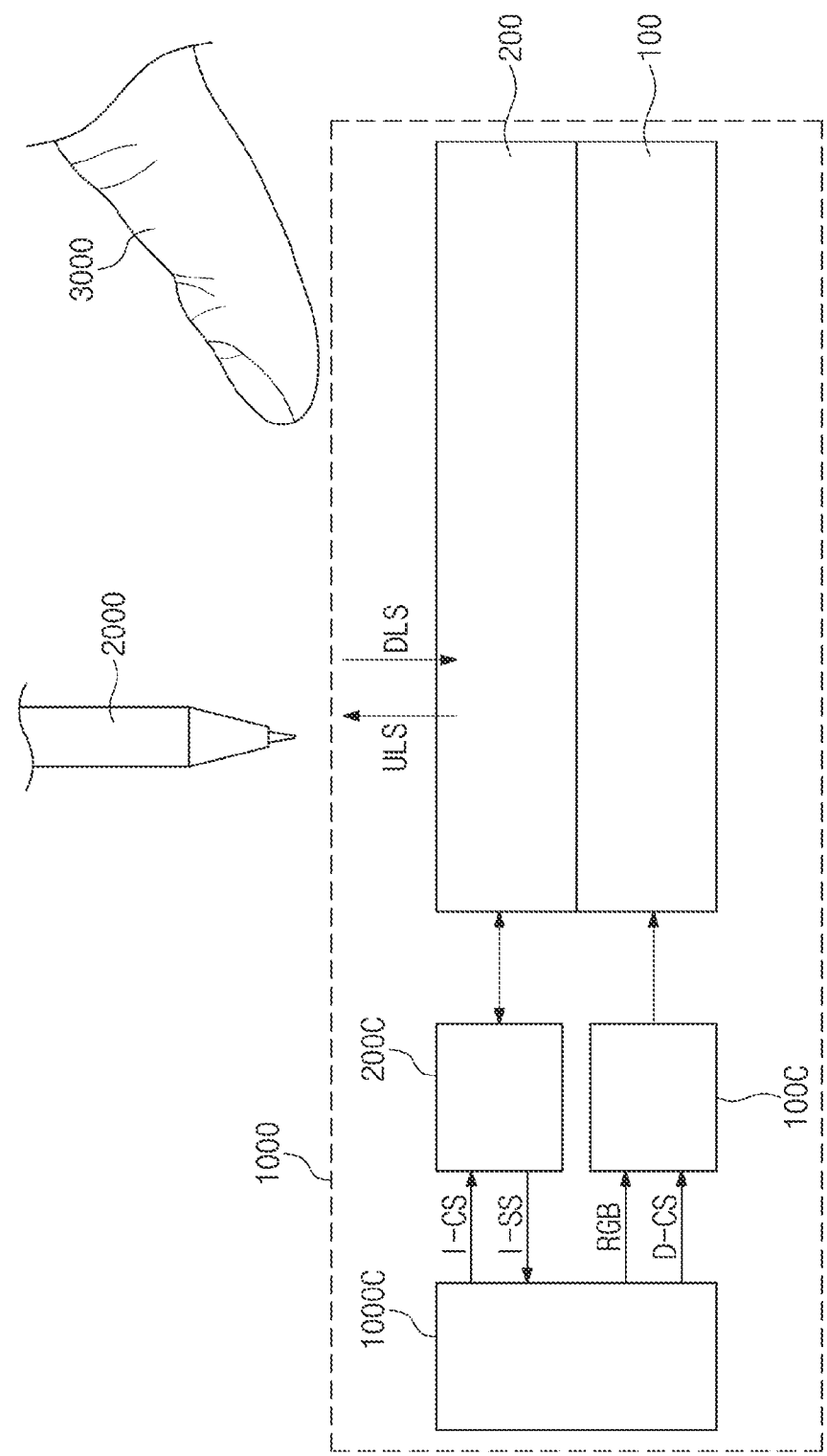
FIG. 2 is a view showing an operation between an electronic device and an input device according to an embodiment of the present disclosure.

FIG. 2 is a view showing an operation between the electronic device 1000 and the input device 2000 according to an embodiment of the present disclosure.

Referring to FIG. 2, the electronic device 1000 may sense inputs applied thereto from the outside of the electronic device 1000. As an example, the electronic device 1000 may sense a first input generated by the input device 2000 and a second input generated by a touch 3000 from a user. The input device 2000 may be an input member of an active type that provides a driving signal, e.g., an active pen. The touch 3000 may be generated by an input member, such as a user's body, a passive pen, etc., that leads to a variation of a capacitance.

The electronic device 1000 and the input device 2000 may communicate bi-directionally with each other. The electronic device 1000 may apply an uplink signal ULS to the input device 2000, and the input device 2000 may apply a downlink signal DLS to the electronic device 1000. For example, the uplink signal ULS may include information, such as panel information, a protocol version, etc., however, it should not be limited thereto or thereby.

The downlink signal DLS may include a synchronization signal or status information of the input device 2000. As an example, the downlink signal DLS may include coordinate information of the input device 2000, battery information of the input device 2000, inclination information of input device 2000, and/or various information stored in the input device 2000, however, it should not be particularly limited.

The electronic device 1000 may include a display layer 100, a sensor layer 200 disposed on the display layer 100, a display driver 100C electrically connected to the display layer 100, a sensor driver 200C electrically connected to the sensor layer 200, and a main driver 1000C electrically connected to the display driver 100C and sensor driver 200C.

The display layer 100 may have a configuration that substantially generates the image. The display layer 100 may be a light emitting type display layer. For example, the display layer 100 may be an organic light emitting display layer, a quantum dot display layer, a micro-LED display layer, or a nano-LED display layer.

The sensor layer 200 may be disposed on the display layer 100. The sensor layer 200 may sense an external input applied thereto from the outside. The sensor layer 200 may sense the first input generated by the input device 2000 and the second input generated by the touch 3000.

The main driver 1000C may control an overall operation of the electronic device 1000. For example, the main driver 1000C may control an operation of the display driver 100C and the sensor driver 200C. The main driver 1000C may include at least one microprocessor, and the main driver 1000C may be referred to as a host.

The display driver 100C may drive the display layer 100. The main driver 1000C may further include a graphics controller. The display driver 100C may receive image data RGB and a control signal D-CS from the main driver 1000C. The control signal D-CS may include a variety of signals. For example, the control signal D-CS may include an input vertical synchronization signal, an input horizontal synchronization signal, a main clock, and a data enable signal. The display driver 100C may generate a vertical synchronization signal and a horizontal synchronization signal based on the control signal D-CS to control a timing at which signals are applied to the display layer 100.

The sensor driver 200C may drive the sensor layer 200. The sensor driver 200C may receive a control signal I-CS from the main driver 1000C. The control signal I-CS may include a mode determination signal to determine a driving mode of the sensor driver 200C and a clock signal.

The sensor driver 200C may be operated in a first mode to sense the first input by the input device 2000 or in a second mode to sense the second input by the touch 3000 based on the control signal I-CS. The sensor driver 200C may be operated in the first mode or in the second mode, which are described with reference to FIGS. 15A, 15B, and 16, based on the mode determination signal.

The sensor driver 200C may calculate coordinate information of the first input or the second input based on the signal from the sensor layer 200 and may apply a coordinate signal I-SS having the coordinate information to the main driver 1000C. The main driver 1000C may perform an operation corresponding to the user's input based on the coordinate signal I-SS. For example, the main driver 1000C may drive the display driver 100C such that the display layer 100 may display a new application image.

Figure 3A:
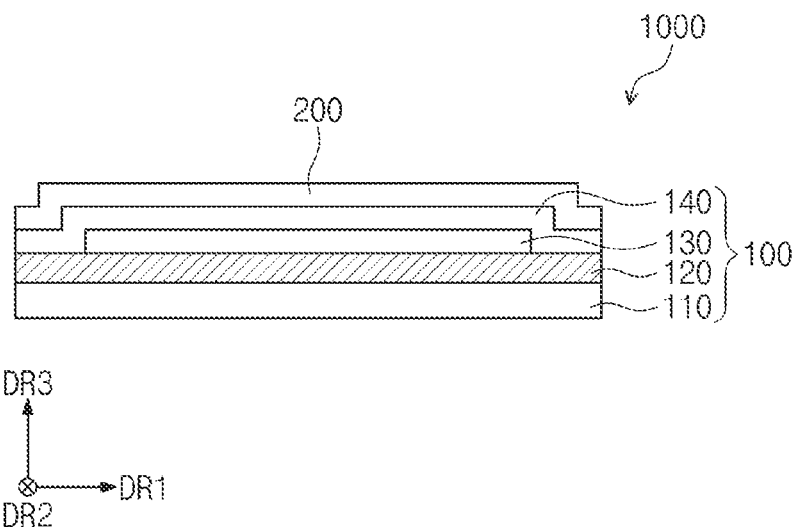
FIG. 3A is a cross-sectional view showing an electronic device according to an embodiment of the present disclosure.
Figure 3B:
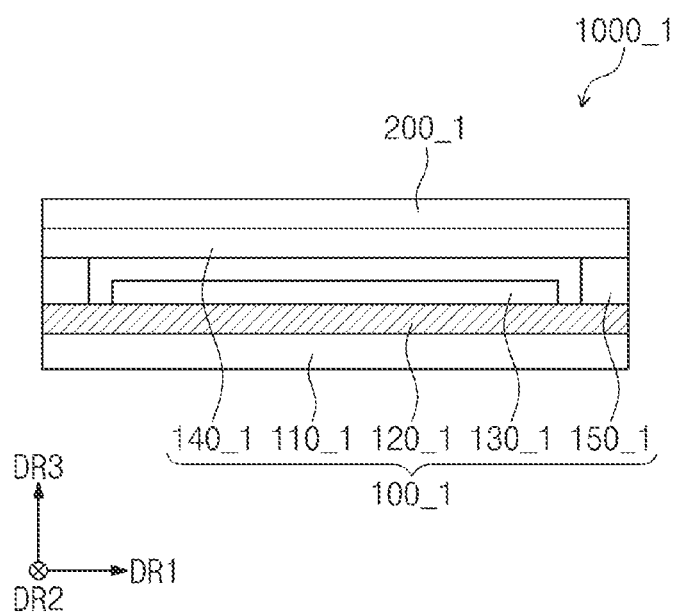
FIG. 3B is a cross-sectional view showing an electronic device according to an embodiment of the present disclosure.

FIG. 3A is a cross-sectional view showing the electronic device 1000 according to an embodiment of the present disclosure, and FIG. 3B is a cross-sectional view showing an electronic device 1000-1 according to an embodiment of the present disclosure.

FIG. 3A is a cross-sectional view showing the electronic device 1000 according to an embodiment of the present disclosure.

Referring to FIG. 3A, the display layer 100 may include a base layer 110, a circuit layer 120, a light emitting element layer 130, and an encapsulation layer 140.

The base layer 110 may provide a base surface on which the circuit layer 120 is disposed. The base layer 110 may be a glass substrate, a metal substrate, or a polymer substrate, however, the embodiment should not be limited thereto or thereby. According to an embodiment, the base layer 110 may be an inorganic layer, an organic layer, or a composite material layer.

The base layer 110 may have a multi-layer structure. For instance, the base layer 110 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide-based resin. In addition, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. In the present disclosure, the term "X-based resin", as used herein, refers to the resin that includes a functional group of X.

The circuit layer 120 may be disposed on the base layer 110. The circuit layer 120 may include an insulating layer, a semiconductor pattern, a conductive pattern, and a signal line. An insulating layer, a semiconductor layer, and a conductive layer may be formed on the base layer 110 by a coating or depositing process. Then, the insulating layer, the semiconductor layer, and the conductive layer may be selectively patterned through several photolithography processes. The semiconductor pattern, the conductive pattern, and the signal line included in the circuit layer 120 may be formed.

The light emitting element layer 130 may be disposed on the circuit layer 120. The light emitting element layer 130 may include a light emitting element. For example, the light emitting element layer 130 may include an organic light emitting material, a quantum dot, a quantum rod, a micro-LED, or a nano-LED.

The encapsulation layer 140 may be disposed on the light emitting element layer 130 and the circuit layer 120. The encapsulation layer 140 may protect the light emitting element layer 130 from moisture, oxygen, and a foreign substance such as dust particles.

The sensor layer 200 may be disposed on the display layer 100. More particularly, the sensor layer 200 may be disposed on the encapsulation layer 140. The sensor layer 200 may sense an external input applied thereto from the outside. For example, the external input may be the user's input. The user input may include a variety of forms of external inputs, such as a part of the user's body, light, heat, pen, or pressure.

The sensor layer 200 may be formed on the display layer 100 through successive processes. In this case, the sensor layer 200 may be described as being disposed directly on the display layer 100. In the present disclosure, the expression "the sensor layer 200 is disposed directly on the display layer 100" means that no intervening elements are present between the sensor layer 200 and the display layer 100. That is, a separate adhesive member may not be disposed between the sensor layer 200 and the display layer 100.

According to an embodiment, the sensor layer 200 may be combined with the display layer 100 by an adhesive member. The adhesive member may include an ordinary adhesive.

Although not shown in figures, the electronic device 1000 may further include an anti-reflective layer and an optical layer, which are disposed on the sensor layer 200. The anti-reflective layer may reduce a reflectance of an external light incident thereto from the outside of the electronic device 1000. The optical layer may control a traveling direction of a light incident thereto from the display layer 100 to improve a front luminance of the electronic device 1000.

FIG. 3B is a cross-sectional view showing the electronic device 1000-1 according to an embodiment of the present disclosure. Referring to FIG. 3B, the electronic device 1000_1 may include a display layer 100_1 and an input sensor 200_1. The display layer 100_1 may include a base substrate 110_1, a circuit layer 120_1, a light emitting element layer 130_1, an encapsulation substrate 140_1, and a coupling member 150_1.

Each of the base substrate 110_1 and the encapsulation substrate 140_1 may be a glass substrate, a metal substrate, or a polymer substrate, however, the embodiment should not be particularly limited.

The coupling member 150_1 may be disposed between the base substrate 110_1 and the encapsulation substrate 140_1. The encapsulation substrate 140_1 may be coupled with the base substrate 110_1 or the circuit layer 120_1 by the coupling member 150_1. The coupling member 150_1 may include an inorganic material or an organic material. For example, the inorganic material may include a frit seal, and the organic material may include a photocurable resin or a photoplastic resin. However, the material for the coupling member 150_1 should not be limited thereto or thereby.

The sensor layer 200_1 may be disposed directly on the encapsulation substrate 140_1. In the following descriptions, the expression that the sensor layer 200_1 is disposed directly on the encapsulation substrate 140_1 means that no intervening elements are present between the sensor layer 200_1 and the encapsulation substrate 140_1. That is, a separate adhesive member may not be disposed between the sensor layer 200_1 and the encapsulation substrate 140_1, however, it should not be limited thereto or thereby. According to an embodiment, an adhesive layer may be further disposed between the sensor layer 200_1 and the encapsulation substrate 140_1.

Figure 4:
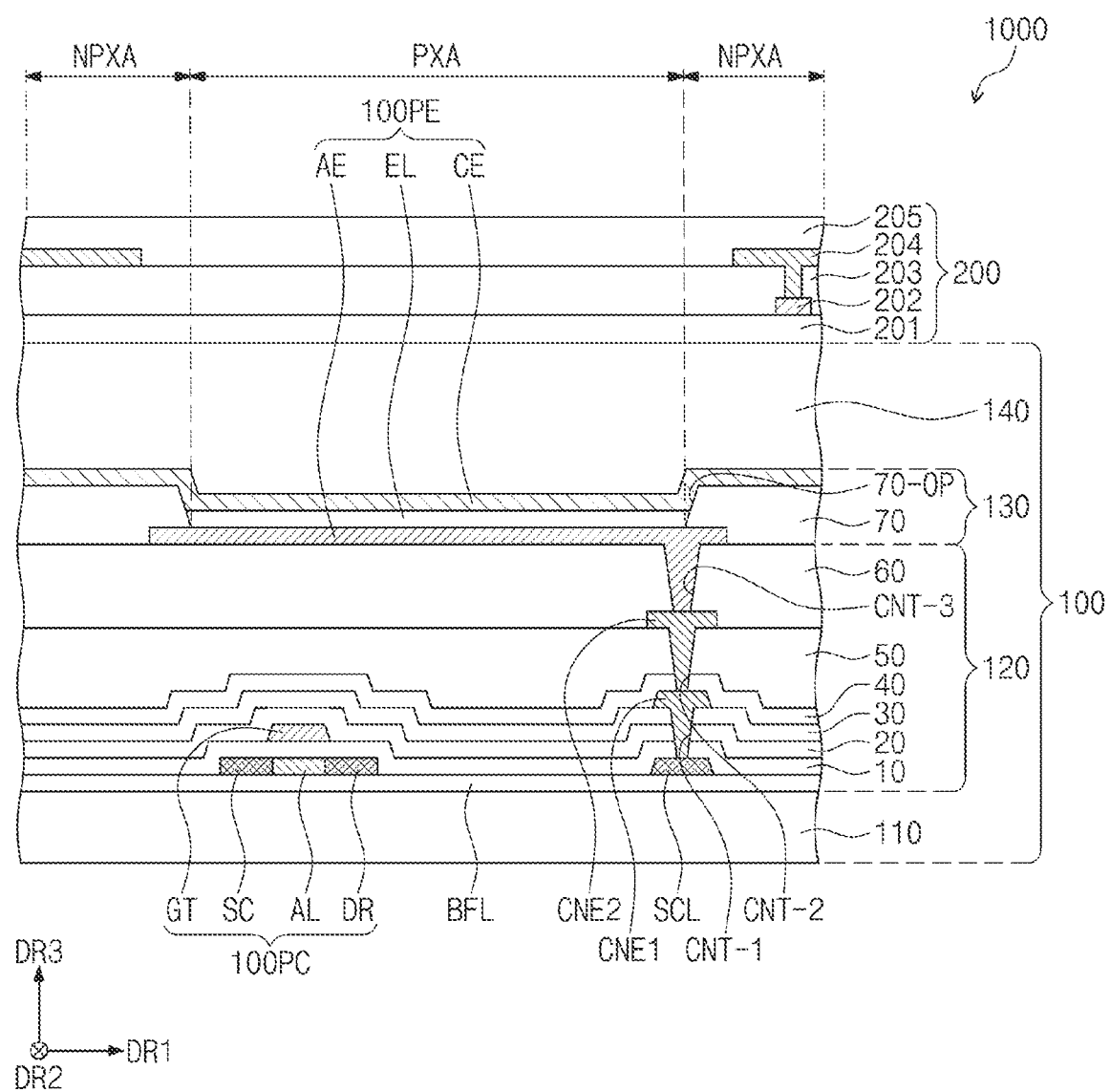
FIG. 4 is a cross-sectional view showing an electronic device according to an embodiment of the present disclosure.

FIG. 4 is a cross-sectional view showing the electronic device 1000 according to an embodiment of the present disclosure.

Referring to FIG. 4, at least one inorganic layer may be formed on an upper surface of the base layer 110. The inorganic layer may include at least one of aluminum oxide, titanium oxide, silicon oxide, silicon nitride, silicon oxynitride, zirconium oxide, and hafnium oxide. The inorganic layer may be formed in multiple layers. The inorganic layers may form a barrier layer and/or a buffer layer. In the present embodiment, the display layer 100 may include a buffer layer BFL. In an embodiment, the buffer layer BFL may be disposed on the base layer 110.

The buffer layer BFL may increase a coupling force between the base layer 110 and the semiconductor pattern. The buffer layer BFL may include at least one of silicon oxide, silicon nitride, and silicon oxynitride. For example, the buffer layer BFL may have a stack structure in which a silicon oxide layer and a silicon nitride layer are alternately stacked with each other.

The semiconductor pattern may be disposed on the buffer layer BFL. The semiconductor pattern may include polysilicon, however, it should not be limited thereto or thereby. The semiconductor pattern may include amorphous silicon, low temperature polycrystalline silicon, or oxide semiconductor.

FIG. 4 shows only a portion of the semiconductor pattern, and the semiconductor pattern may be further disposed in other areas. The semiconductor pattern may be arranged with a specific rule over pixels. The semiconductor pattern may have different electrical properties depending on whether it is doped or not or whether it is doped with an N-type dopant or a P-type dopant. The semiconductor pattern may include a first region having a relatively high conductivity and a second region having a relatively low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or a region doped at a concentration lower than that of the first region.

The first region may have a conductivity greater than that of the second region and may substantially serve as an electrode or signal line. The second region may substantially correspond to an active (or a channel) of the transistor. In other words, a portion of the semiconductor pattern may be the active of the transistor, another portion of the semiconductor pattern may be a source or a drain of the transistor, and the other portion of the semiconductor pattern may be a connection electrode or a connection signal line.

Each of the pixels may have an equivalent circuit that includes seven transistors, one capacitor, and a light emitting element, and the equivalent circuit of the pixel may be changed in various ways. FIG. 4 shows one transistor 100PC and the light emitting element 100PE included in the pixel.

A source SC, an active AL, and a drain DR of the transistor 100PC may be formed from the semiconductor pattern. The source SC and the drain DR may extend in opposite directions to each other from the active AL in a cross-section. FIG. 4 shows a portion of a connection signal line SCL formed from the semiconductor pattern. Although not shown in figures, the connection signal line SCL may be connected to the drain DR of the transistor 100PC in a plane.

A first insulating layer 10 may be disposed on the buffer layer BFL. The first insulating layer 10 may commonly overlap the pixels and may cover the semiconductor pattern. The first insulating layer 10 may be an inorganic layer and/or an organic layer and may have a single-layer or multi-layer structure. The first insulating layer 10 may include at least one of aluminum oxide, titanium oxide, silicon oxide, silicon nitride, silicon oxynitride, zirconium oxide, and hafnium oxide. In the present embodiment, the first insulating layer 10 may have a single-layer structure of a silicon oxide layer.

Not only the first insulating layer 10, but also an insulating layer of the circuit layer 120 described later may be an inorganic layer and/or an organic layer and may have a single-layer or multi-layer structure. The inorganic layer may include at least one of the above-mentioned materials, however, it should not be limited thereto or thereby.

A gate GT of the transistor 100PC may be disposed on the first insulating layer 10. The gate GT may be a portion of a metal pattern. The gate GT may overlap the active AL. The gate GT may be used as a mask in a process of doping the semiconductor pattern.

A second insulating layer 20 may be disposed on the first insulating layer 10 and may cover the gate GT. The second insulating layer 20 may commonly overlap the pixels. The second insulating layer 20 may be an inorganic layer and/or an organic layer and may have a single-layer or multi-layer structure. The second insulating layer 20 may include at least one of silicon oxide, silicon nitride, and silicon oxynitride. In the present embodiment, the second insulating layer 20 may have a multi-layer structure of a silicon oxide layer and a silicon nitride layer.

A third insulating layer 30 may be disposed on the second insulating layer 20. The third insulating layer 30 may have a single-layer or multi-layer structure. As an example, the third insulating layer 30 may have a multi-layer structure of a silicon oxide layer and a silicon nitride layer.

A first connection electrode CNE1 may be disposed on the third insulating layer 30. The first connection electrode CNE1 may be connected to the connection signal line SCL via a contact hole CNT-1 defined through the first, second, and third insulating layers 10, 20, and 30.

A fourth insulating layer 40 may be disposed on the third insulating layer 30. The fourth insulating layer 40 may have a single-layer structure of a silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 via a contact hole CNT-2 defined through the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer.

The light emitting element layer 130 may be disposed on the circuit layer 120. The light emitting element layer 130 may include the light emitting element 100PE. The light emitting element layer 130 may include an organic light emitting material, a quantum dot, a quantum rod, a micro-LED, or a nano-LED. Hereinafter, the organic light emitting element is described as the light emitting element 100PE, however, it should not be particularly limited.

The light emitting element 100PE may include a first electrode AE, a light emitting layer EL, and a second electrode CE.

The first electrode AE may be disposed on the sixth insulating layer 60. The first electrode AE may be connected to the second connection electrode CNE2 via a contact hole CNT-3 defined through the sixth insulating layer 60.

A pixel definition layer 70 may be disposed on the sixth insulating layer 60 and may cover a portion of the first electrode AE. An opening 70-OP is defined through the pixel definition layer 70. At least a portion of the first electrode AE may be exposed through the opening 70-OP.

The active area 1000A (refer to FIG. 1) may include a light emitting area PXA and a non-light-emitting area NPXA adjacent to the light emitting area PXA. The non-light-emitting area NPXA may surround the light emitting area PXA. In the present embodiment, the light emitting area PXA may be defined to correspond to the portion of the first electrode AE exposed through the opening 70-OP.

The light emitting layer EL may be disposed on the first electrode AE. The light emitting layer EL may be disposed in an area corresponding to the opening 70-OP. That is, the light emitting layer EL may be disposed in each pixel after being divided into plural portions. When the light emitting layer EL is formed in each pixel after being divided into plural portions, each of the light emitting layers may emit a light having one of a blue color, a red color, and a green color, however, it should not be limited thereto or thereby. According to an embodiment, the light emitting layer EL may be commonly provided in the pixels to be connected to each other. In this case, the light emitting layer EL may provide a blue light or a white light.

The second electrode CE may be disposed on the light emitting layer EL. The second electrode CE may have an integral shape and may be commonly disposed over the pixels.

Although not shown in figures, a hole control layer may be disposed between the first electrode AE and the light emitting layer EL. The hole control layer may be commonly disposed in the light emitting area PXA and the non-light-emitting area NPXA. The hole control layer may include a hole transport layer and may further include a hole injection layer. An electron control layer may be disposed between the light emitting layer EL and the second electrode CE. The electron control layer may include an electron transport layer and may further include an electron injection layer. Each of the hole control layer and the electron control layer may be commonly formed in the plural pixels using an open mask.

The encapsulation layer 140 may be disposed on the light emitting element layer 130. The encapsulation layer 140 may include an inorganic layer, an organic layer, and an inorganic layer, which are sequentially stacked one on another, however, the layers of the encapsulation layer 140 should not be limited thereto or thereby.

The inorganic layers may protect the light emitting element layer 130 from moisture and oxygen, and the organic layer may protect the light emitting element layer 130 from a foreign substance such as dust particles. The inorganic layers may include a silicon nitride layer, a silicon oxynitride layer, a silicon oxide layer, a titanium oxide layer, or an aluminum oxide layer. The organic layer may include an acrylate-based organic layer, however, it should not be limited thereto or thereby.

The sensor layer 200 may be disposed on the encapsulation layer 140 and include a first sensing insulating layer 201, a first conductive layer 202, a second sensing insulating layer 203, a second conductive layer 204, and a third sensing insulating layer 205.

The first sensing insulating layer 201 may be an inorganic layer including at least one of silicon nitride, silicon oxynitride, and silicon oxide. According to an embodiment, the first sensing insulating layer 201 may be an organic layer including an epoxy-based resin, an acrylate-based resin, or an imide-based resin. The first sensing insulating layer 201 may have a single-layer structure or a multi-layer structure of layers stacked in the third direction DR3 and may be disposed in the light emitting area PXA and the non-light-emitting area NPXA.

Each of the first conductive layer 202 and the second conductive layer 204 may have a single-layer structure or a multi-layer structure of layers stacked in the third direction DR3 and may be disposed in the light emitting area PXA, but not in the non-light-emitting area NPXA.

The conductive layer having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (IZTO), or the like. In addition, the transparent conductive layer may include conductive polymer such as PEDOT, metal nanowire, graphene, or the like.

The conductive layer having the multi-layer structure may include metal layers. The metal layers may have a three-layer structure of titanium/aluminum/titanium. The conductive layer having the multi-layer structure may include at least one metal layer and at least one transparent conductive layer.

The second sensing insulating layer 203 and the third sensing insulating layer 205 may be disposed in the light emitting area PXA and the non-light-emitting area NPXA. At least one of the second sensing insulating layer 203 and the third sensing insulating layer 205 may include an inorganic layer. The inorganic layer may include at least one of aluminum oxide, titanium oxide, silicon oxide, silicon nitride, silicon oxynitride, zirconium oxide, and hafnium oxide.

At least one of the second sensing insulating layer 203 and the third sensing insulating layer 205 may include an organic layer. The organic layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

Figure 5:
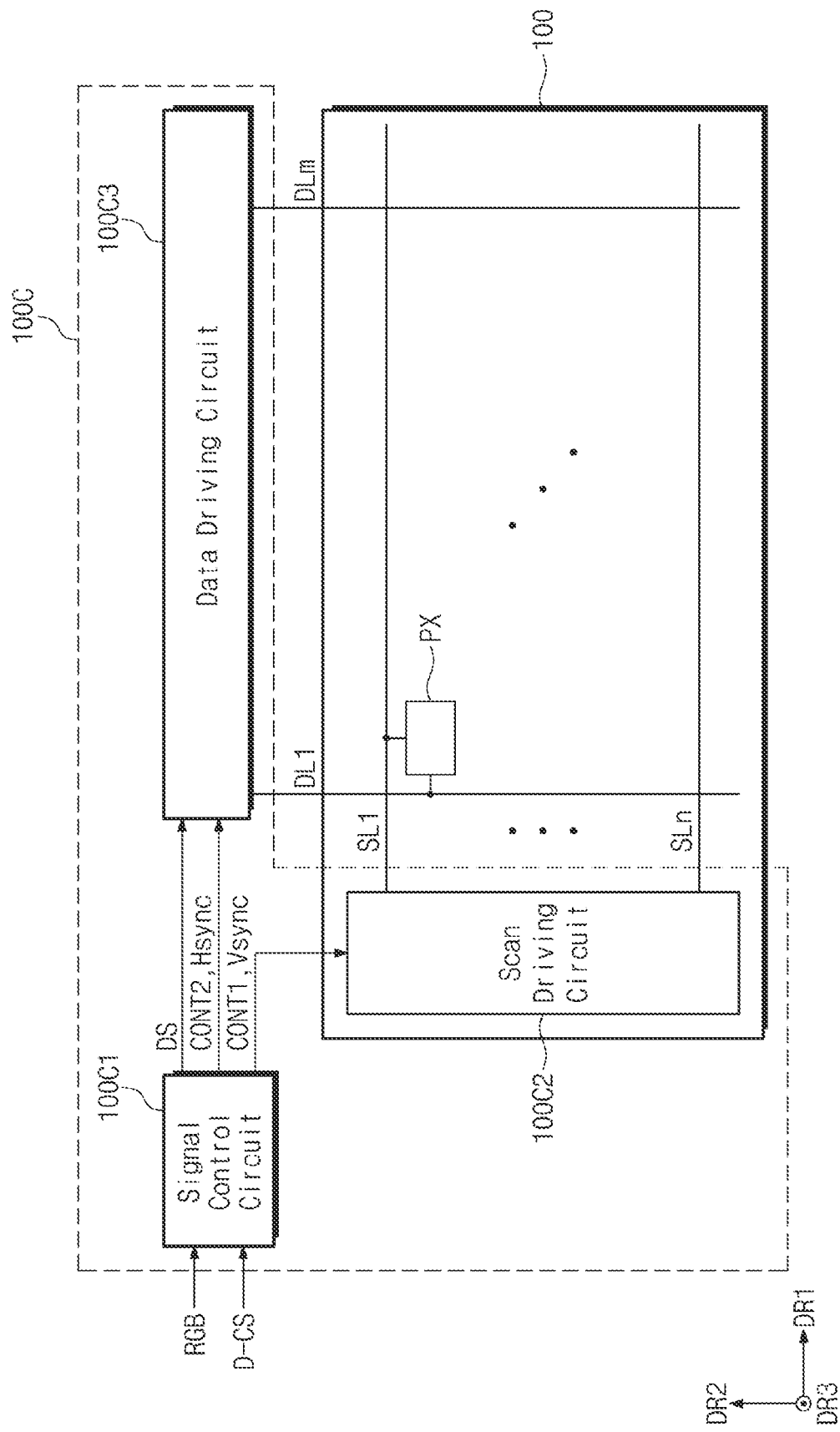
FIG. 5 is a block diagram showing a display layer and a display driver according to an embodiment of the present disclosure.

FIG. 5 is a block diagram showing the display layer 100 and the display driver 100C according to an embodiment of the present disclosure.

Referring to FIG. 5, the display layer 100 may include a plurality of scan lines SL1 to SLn, a plurality of data lines DL1 to DLm, and a plurality of pixels PX. Each of the pixels PX may be connected to a corresponding data line of the data lines DL1 to DLm and a corresponding scan line of the scan lines SL1 to SLn. According to an embodiment, the display layer 100 may further include light emitting control lines, and the display driver 100C may further include a light emitting driving circuit applying control signals to the light emitting control lines. Configurations of the display layer 100 should not be particularly limited.

The display driver 100C may include a signal control circuit 100C1, a scan driving circuit 100C2, and a data driving circuit 100C3. The signal control circuit 100C1 may be electrically connected to the scan driver circuit 100C2 which is included in the display layer 100 and may be electrically connected to the data driving circuit 100C3.

The signal control circuit 100C1 may receive the image data RGB and the control signal D-CS from the main driver 1000C (refer to FIG. 2). The control signal D-CS may include a variety of signals. As an example, the control signal D-CS may include the input vertical synchronization signal, the input horizontal synchronization signal, the main clock, and the data enable signal.

The signal control circuit 100C1 may generate a first control signal CONT1 and the vertical synchronization signal Vsync based on the control signal D-CS and may output the first control signal CONT1 and the vertical synchronization signal Vsync to the scan driving circuit 100C2. The vertical synchronization signal Vsync may be included in the first control signal CONT1.

The signal control circuit 100C1 may generate a second control signal CONT2 and the horizontal synchronization signal Hsync based on the control signal D-CS and may output the second control signal CONT2 and the horizontal synchronization signal Hsync to the data driving circuit 100C3. The horizontal synchronization signal Hsync may be included in the second control signal CONT2.

In addition, the signal control circuit 100C1 may output a data signal DS obtained by processing the image data RGB according to an operational condition of the display layer 100 to the data driving circuit 100C3. The first control signal CONT1 and the second control signal CONT2 may be signals required for an operation of the scan driving circuit 100C2 and the data driving circuit 100C3 and should not be particularly limited.

The scan driving circuit 100C2 may drive the scan lines SL1 to SLn in response to the first control signal CONT1 and the vertical synchronization signal Vsync. According to an embodiment, the scan driving circuit 100C2 may be formed through the same process as the circuit layer 120 (refer to FIG. 4) of the display layer 100, however, it should not be limited thereto or thereby. As an example, the scan driving circuit 100C2 may be directly mounted on a predetermined area of the display layer 100 after being implemented in an integrated circuit (IC) or may be electrically connected to the display layer 100 after being mounted on a separate printed circuit board in a chip-on-film (COF).

The data driving circuit 100C3 may output grayscale voltages to drive the data lines DL1 to DLm in response to the second control signal CONT2, the horizontal synchronization signal Hsync, and the data signal DS from the signal control circuit 100C1. The data driving circuit 100C3 may be directly mounted on a predetermined area of the display layer 100 after being implemented in an integrated circuit (IC) or may be electrically connected to the display layer 100 after being mounted on a separate printed circuit board in a chip-on-film (COF), however, it should not be limited thereto or thereby. For example, the data driving circuit 100C3 may be formed through the same process as the circuit layer 120 (refer to FIG. 4) of the display layer 100.

Figure 6:
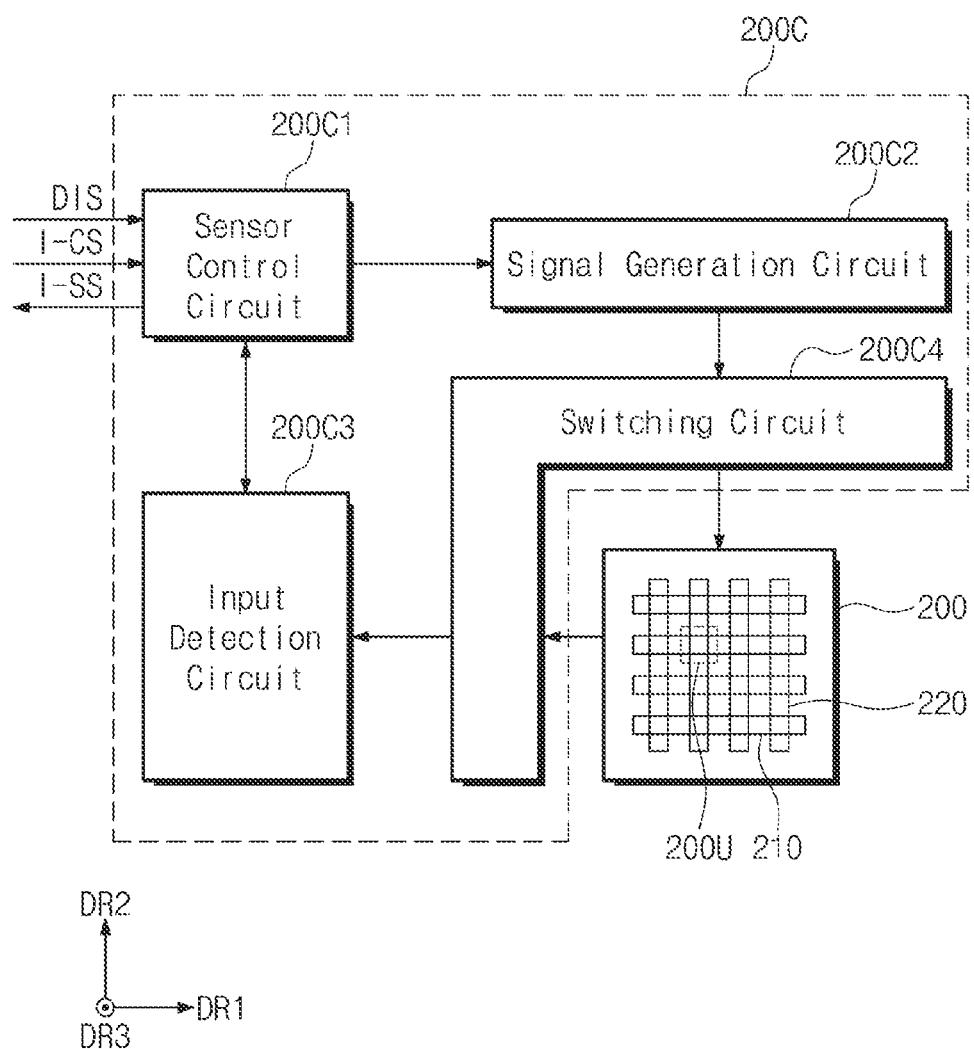
FIG. 6 is a block diagram showing a sensor layer and a sensor driver according to an embodiment of the present disclosure.

FIG. 6 is a block diagram showing the sensor layer 200 and the sensor driver 200C according to an embodiment of the present disclosure.

Referring to FIG. 6, the sensor layer 200 may include a plurality of first electrodes 210 extending in the first direction DR1 and a plurality of second electrodes 220 extending in the second direction DR2. The second electrodes 220 may cross the first electrodes 210. Although not shown in figures, the sensor layer 200 may further include a plurality of signal lines connected to the first electrodes 210 and the second electrodes 220.

In FIG. 6, the first electrodes 210 and the second electrodes 220 are shown as having a line shape, however, this is merely for the convenience of explanation. Each of the first electrodes 210 and the second electrodes 220 may include sensing patterns that are symmetrically patterned. This will be described in detail later.

The sensor driver 200C may comprise a sensor control circuit 200C1, a signal generation circuit 200C2 which is electrically connected to the sensor control circuit 200C1, an input detection circuit 200C3 which is electrically connected to the sensor control circuit 200C1, and an operation of a switching circuit 200C4 which is electrically connected to the signal generation circuit 200C2 and the input detection circuit 200C3. The sensor direr 200C may be electrically connected to the sensor layer 200. That is, the operation of a switching circuit 200C4 is electrically connected to the sensor layer 200.

The sensor driver 200C may receive the control signal I-CS from the main driver 1000C (refer to FIG. 2) and may apply the coordinate signal I-SS to the main driver 1000C (refer to FIG. 2). In addition, the sensor driver 200C may receive image information data DIS. The image information data DIS may be provided by the display driver 100C (refer to FIG. 2) or the main driver 1000C (refer to FIG. 2).

The image information data DIS may be calculated based on the image data RGB (refer to FIG. 5). As an example, the image information data DIS may include noise information about the image that is to be displayed through the display layer 100 (refer to FIG. 5). The sensor driver 200C may generate an output signal based on the image information data DIS including the noise information and may output the output signal to the sensor layer 200.

A sensor control circuit 200C1 may control an operation of a signal generation circuit 200C2 and an operation of a switching circuit 200C4, may calculate the coordinate of the external signal from the driving signal provided from an input detection circuit 200C3, or may analyze information generated by the active pen based on a modulation signal provided from the input detection circuit 200C3.

The signal generation circuit 200C2 may apply the output signal (or the driving signal) that is called a TX signal to the sensor layer 200. The signal generation circuit 200C2 may output the output signal corresponding to an operational mode to sensor layer 200.

The input detection circuit 200C3 may convert an analog signal provided from sensor layer 200 and called an RX signal (or a sensing signal) to a digital signal. The input detection circuit 200C3 may amplify the received analog signal and may filter the amplified signal. The input detection circuit 200C3 may convert the filtered signal to the digital signal. The switching circuit 200C4 may selectively control an electrical connection relationship between the sensor layer 200 and the signal generation circuit 200C2 and/or the input detection circuit 200C3 in response to the control by the sensor control circuit 200C1. Responsive to the control by the sensor control circuit 200C1, the switching circuit 200C4 may connect one group of the first electrodes 210 and the second electrodes 220 to the signal generation circuit 200C2 or may connect each of the first electrodes 210 and the second electrodes 220 to the signal generation circuit 200C2. According to an embodiment, the switching circuit 200C4 may connect one group of the first electrodes 210 and the second electrodes 220 or both the first electrodes 210 and the second electrodes 220 to the input detection circuit 200C3.

Figure 7:
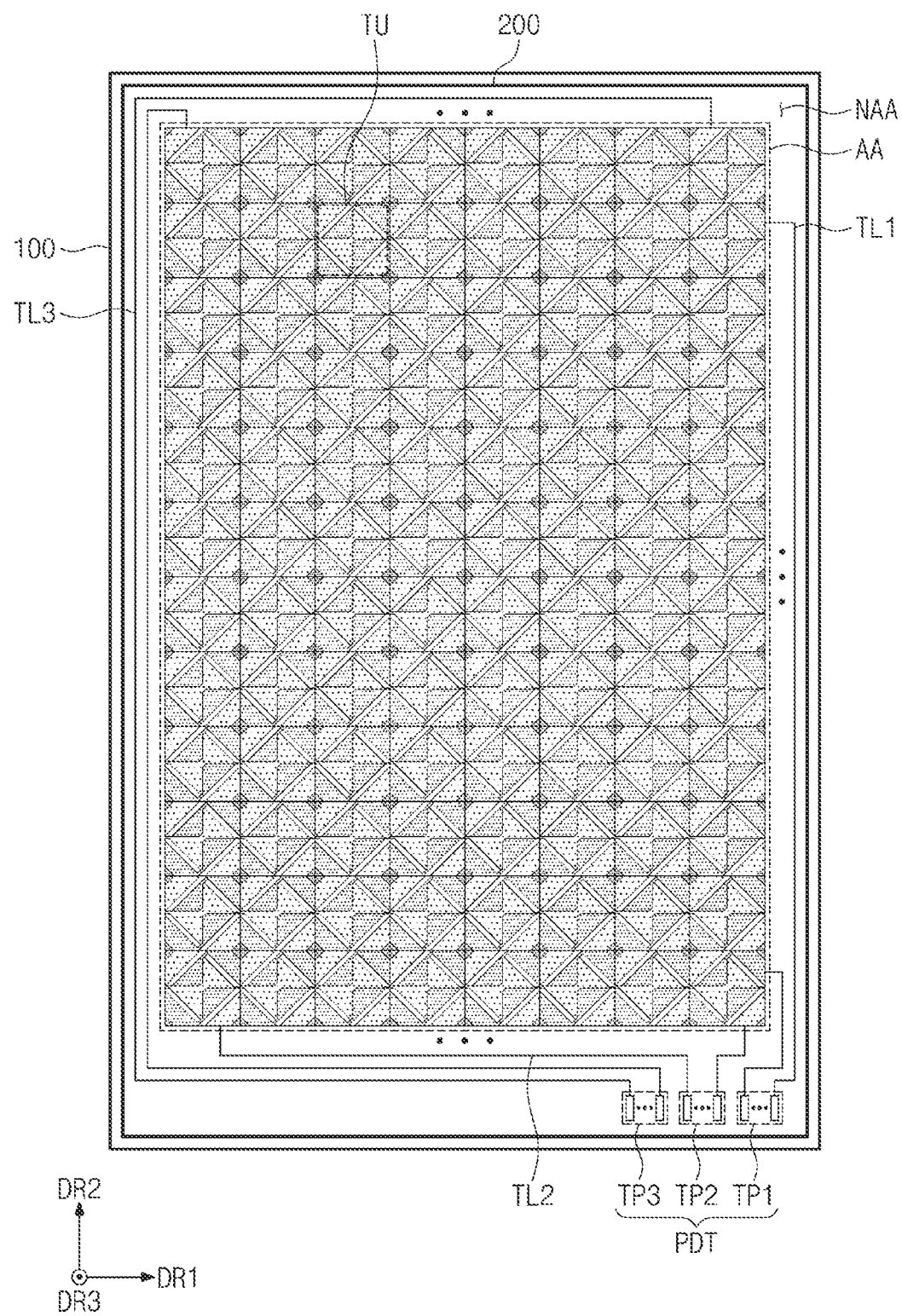
FIG. 7 is a plan view showing a sensor layer according to an embodiment of the present disclosure.
Figure 8:
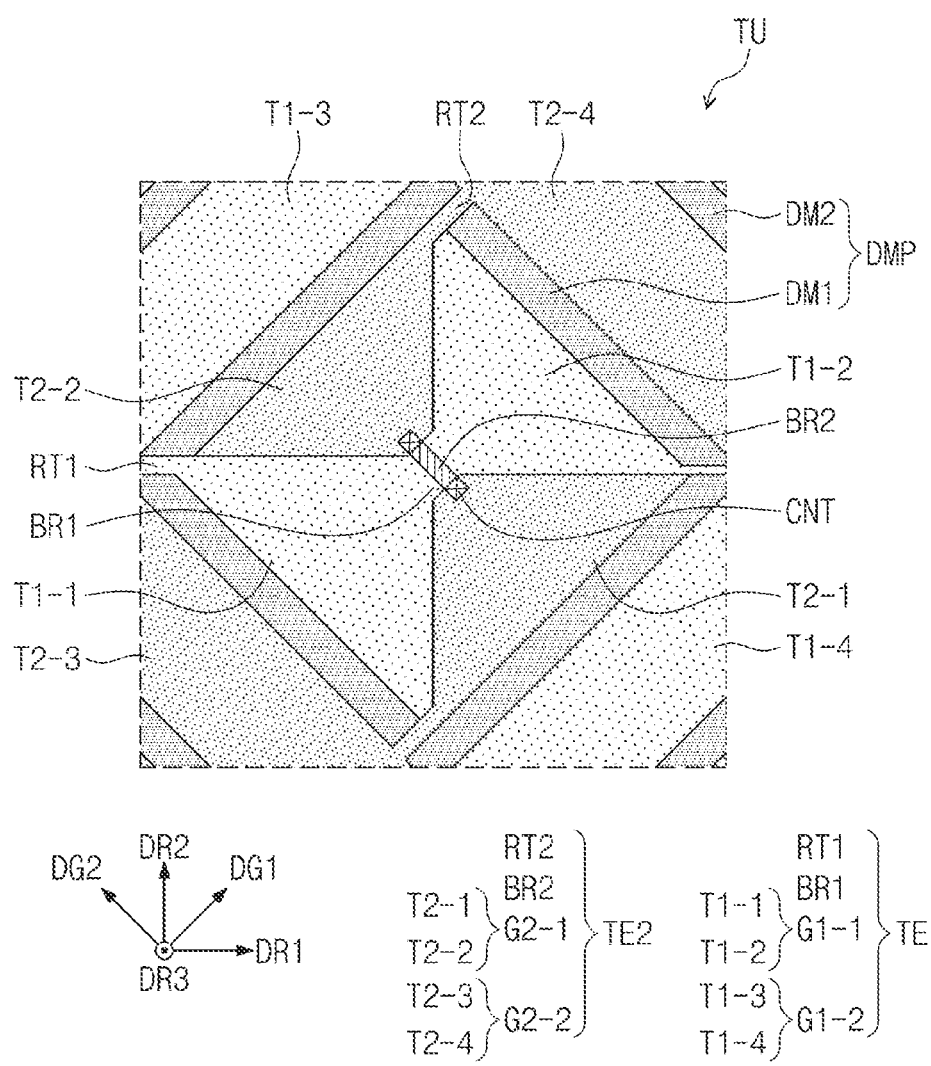
FIG. 8 is a plan view showing one sensing area according to an embodiment of the present disclosure.

FIG. 7 is a plan view showing the sensor layer 200 according to an embodiment of the present disclosure, and FIG. 8 is a plan view showing one sensing area according to an embodiment of the present disclosure. FIG. 8 is an enlarged plan view showing a sensing unit TU of FIG. 7.

Referring to FIGS. 7 and 8, the sensor layer 200 may include sensing patterns TE1 and TE2, sensing lines TL1, TL2, and TL3, and sensing pads PDT, which are disposed on the display layer 100. The sensing patterns TE1 and TE2 may be disposed in an active area AA, and the sensing lines TL1, TL2, and TL3 and the sensing pads PDT may be disposed in a peripheral area NAA. The active area AA may be defined as an area in which the external input or the active penis sensed.

Each of the electrodes 210 and 220 described with reference to FIG. 6 may be formed by a combination of the sensing patterns TE1 and TE2 included in the one sensing unit TU.

Hereinafter, patterns disposed in one sensing unit TU among the first electrodes 210 are referred to as a first sensing pattern TE1, and patterns disposed in one sensing unit TU among the second electrodes 220 are referred to as a second sensing pattern TE2.

In the present embodiment, the sensing unit TU may have a quadrangular shape defined by the first direction DR1 and the second direction DR2, however, it should not be limited thereto or thereby. The sensing unit TU may have a lozenge shape defined by a first oblique direction DG1 and a second oblique direction DG2 and should not be particularly limited.

In the present embodiment, the first sensing pattern TE1 disposed in the sensing unit TU may include a first-first pattern T1-1, a first-second pattern T1-2, a first-third pattern T1-3, a first-fourth pattern T1-4, a first bridge pattern BR1, and a first extension pattern RT1. The first-first pattern T1-1 and the first-second pattern T1-2 may be defined as a first-first group G1-1, and the first-third pattern T1-3 and the first-fourth pattern T1-4 may be defined as a first-second group G1-2.

In the present embodiment, the second sensing pattern TE2 disposed in the sensing unit TU may include a second-first pattern T2-1, a second-second pattern T2-2, a second-third pattern T2-3, a second-fourth pattern T2-4, a second bridge pattern BR2, and a second extension pattern RT2. The second-first pattern T2-1 and the second-second pattern T2-2 may be defined as a second-first group G2-1, and the second-third pattern T2-3 and the second-fourth pattern T2-4 may be defined as a second-second group G2-2.

The first-first pattern T1-1 and the first-second pattern T1-2 of the first sensing pattern TE1 may be spaced apart from each other in the first oblique direction DG1. The first bridge pattern BR1 may be disposed between the first-first pattern T1-1 and the first-second pattern T1-2. In the present embodiment, the first bridge pattern BR1 may be defined as a portion in which at least a portion of a portion disposed between first-first pattern T1-1 and the first-second pattern T1-2 overlaps the second bridge pattern BR2.

The first-first pattern T1-1, the first-second pattern T1-2, and the first bridge pattern BR1 may be formed as substantially one pattern, and the first-first pattern T1-1, the first-second pattern T1-2, and the first bridge pattern BR1 may be described separately for the convenience of explanation.

The first-third pattern T1-3 and the first-fourth pattern T1-4 of the first sensing pattern TE1 may be spaced apart from each other with the first-first group G1-1 and the second-first group G2-1 interposed therebetween in the second oblique direction DG2. The first-third pattern T1-3 may face the second-second pattern T2-2, and the first-fourth pattern T1-4 may face the second-first pattern T2-1.

The first-third pattern T1-3 and the first-fourth pattern T1-4 may be connected to the first-first group G1-1 by the first extension pattern RT1. Accordingly, the first-third pattern T1-3 and the first-fourth pattern T1-4 may receive the same signal as the first-first group G1-1 even though the first-third pattern T1-3 and the first-fourth pattern T1-4 are spaced apart from each other with the second-first group G2-1 interposed therebetween in the second oblique direction DG2.

The second-first pattern T2-1 and the second-second pattern T2-2 of the second sensing pattern TE2 may be spaced apart from each other in the second oblique direction DG2. The second bridge pattern BR2 may connect the second-first pattern T2-1 to the second-second pattern T2-2.

In the present embodiment, the second bridge pattern BR2 may be disposed on a different layer from the other patterns except the second bridge pattern BR2 in the first sensing pattern TE1 and the second sensing pattern TE2. As an example, the second bridge pattern BR2 may be a component included in the first conductive layer 202 described with reference to FIG. 4. Accordingly, the second bridge pattern BR2 may be disposed on the first sensing insulating layer 201 and may be covered by the second sensing insulating layer 203. The second-first pattern T2-1 and the second-second pattern T2-2 spaced apart from the second-first pattern T2-1 in the second oblique direction DG2 may be connected to the second bridge pattern BR2 via a contact hole CNT defined through the second sensing insulating layer 203. Accordingly, although the first bridge pattern BR1 crosses over the first-first pattern T1-1 and the first-second pattern T1-2, the second-first pattern T2-1 and the second-second pattern T2-2 may be connected to each other by the second bridge pattern BR2 disposed on another layer.

The second-third pattern T2-3 and the second-fourth pattern T2-4 of the second sensing pattern TE2 may be spaced apart from each other with respect to the first-first group G1-1 and the second-first group G2-1 interposed therebetween in the first oblique direction DG1. The second-third pattern T2-3 may face the first-first pattern T1-1, and the second-fourth pattern T2-4 may face the first-second pattern T1-2.

The second-third pattern T2-3 and the second-fourth pattern T2-4 may be connected to the second-first group G2-1 by the second extension pattern RT2. Accordingly, although the second-third pattern T2-3 and the second-fourth pattern T2-4 are spaced apart from each other with the first-first group G1-1 interposed therebetween in the first oblique direction DG1, the second-third pattern T2-3 and the second-fourth pattern T2-4 may receive the same signal as the second-first group G2-1.

In the present embodiment, the first extension pattern RT1 may be provided in plural, and the first extension patterns may be disposed between patterns of the first sensing pattern TE1, which are spaced apart from each other by the second sensing pattern TE2 and a dummy pattern DMP. The second extension pattern RT2 may be provided in plural, and the second extension patterns may be disposed between patterns of the second sensing pattern TE2, which are spaced apart from each other by the first sensing pattern TE1 and the dummy pattern DMP.

The first extension patterns and the second extension patterns may be disposed between corresponding patterns and may be spaced apart from each other while being arranged in a clockwise direction.

According to the present embodiment, the first-first pattern T1-1, the second-second pattern T2-2, the first-second pattern T1-2, and the second-first pattern T2-1 may be sequentially arranged in the clockwise direction.

In this case, the first-third pattern T1-3 may face the second-second pattern T2-2, the first-fourth pattern T1-4 may face the second-first pattern T2-1, the second-third pattern T2-3 may face the first-first pattern T1-1, and the second-fourth pattern T2-4 may face the first-second pattern T1-2.

In this embodiment, an area of each of the first-first pattern T1-1, the first-second pattern T1-2, the second-first pattern T2-1, and the second-second pattern T2-2 may be smaller than an area of a plurality patterns included in the first-second group G1-2 and the second-second group G2-2.

In the present embodiment, the sensor layer 200 may further include the dummy pattern DMP. The dummy pattern DMP may be disposed between patterns receiving different signals from each other. The dummy pattern DMP may be disposed on the second sensing insulating layer 203 described with reference to FIG. 4.

The dummy pattern DMP may include a first dummy pattern DM1 and a second dummy pattern DM2. The first dummy pattern DM1 may be provided in plural, may extend in the first oblique direction DG1 and the second oblique direction DG2, and may be disposed between the patterns receiving different signals from each other. The second dummy pattern DM2 may be provided in plural and may be disposed at corners of the sensing unit TU. That is, the second dummy pattern DM2 may surround the dummy pattern DM1.

The sensing lines TL1, TL2, and TL3 may be disposed in the peripheral area NAA. The sensing lines TL1, TL2, and TL3 may include a first sensing line TL1, a second sensing line TL2, and a third sensing line TL3.

The first sensing line TL1 may be connected to the second sensing pattern TE2. That is, the first sensing line TL1 may be connected to the second-fourth pattern T2-4. The second sensing line TL2 may be connected to one end of the first sensing pattern TE1, and the third sensing line TL3 may be connected to the other end of the first sensing pattern TEE That is, the second sensing line TLW2 may be connected to the first-fourth pattern T1-4, and the third sensing line TL3 may be connected to the first-third pattern T1-3. The other end of the first sensing pattern TE1 may be a portion opposite to one end of the first electrode 210 in the second direction DR2.

According to an embodiment, first sensing pattern TE1 may be connected to the second sensing line TL2 and the third sensing line TL3. Accordingly, a sensitivity of the first sensing line TL1 having a length longer than the second sensing line TL2 may be uniformly maintained regardless of its areas, however, this is merely one example. According to an embodiment, the third sensing line TL3 may be omitted, and the first, second, and third sensing lines TL1, TL2, and TL3 should not be particularly limited.

The sensing pads PDT may be disposed in the peripheral area NAA. The sensing pads PDT may include a first sensing pad TP1, a second sensing pad TP2, and a third sensing pad TP3. The first sensing pad TP1 may be connected to the first sensing line TL1 and may be electrically connected to the second sensing pattern TE2. The second sensing pad TP2 may be connected to the second sensing line TL2, and the third sensing pad TP3 may be connected to the third sensing line TL3. Accordingly, the second sensing pad TP2 and the third sensing pad TP3 may be electrically connected to the first sensing pattern TEE As shown in FIG. 7, according to the present disclosure, in a case where the sensing units are arranged in the first direction DR1 and the second direction DR2, the sensing units surrounding one sensing unit TU may be provided with patterns having similar shape and area. Accordingly, a capacitance formed between the first sensing pattern TE1 and the second sensing pattern TE2 by the input of the active pen may be uniformly maintained not only in a center area of the sensing unit TU but also in an outer area of the sensing unit TU. Therefore, even though the input by the active pen is provided with a tilted angle, the capacitance may be uniformly provided regardless of areas to which the input by the active pen is provided. Thus, the sensor layer 200 of the electronic device 1000 may have improved linearity.

Figure 9:
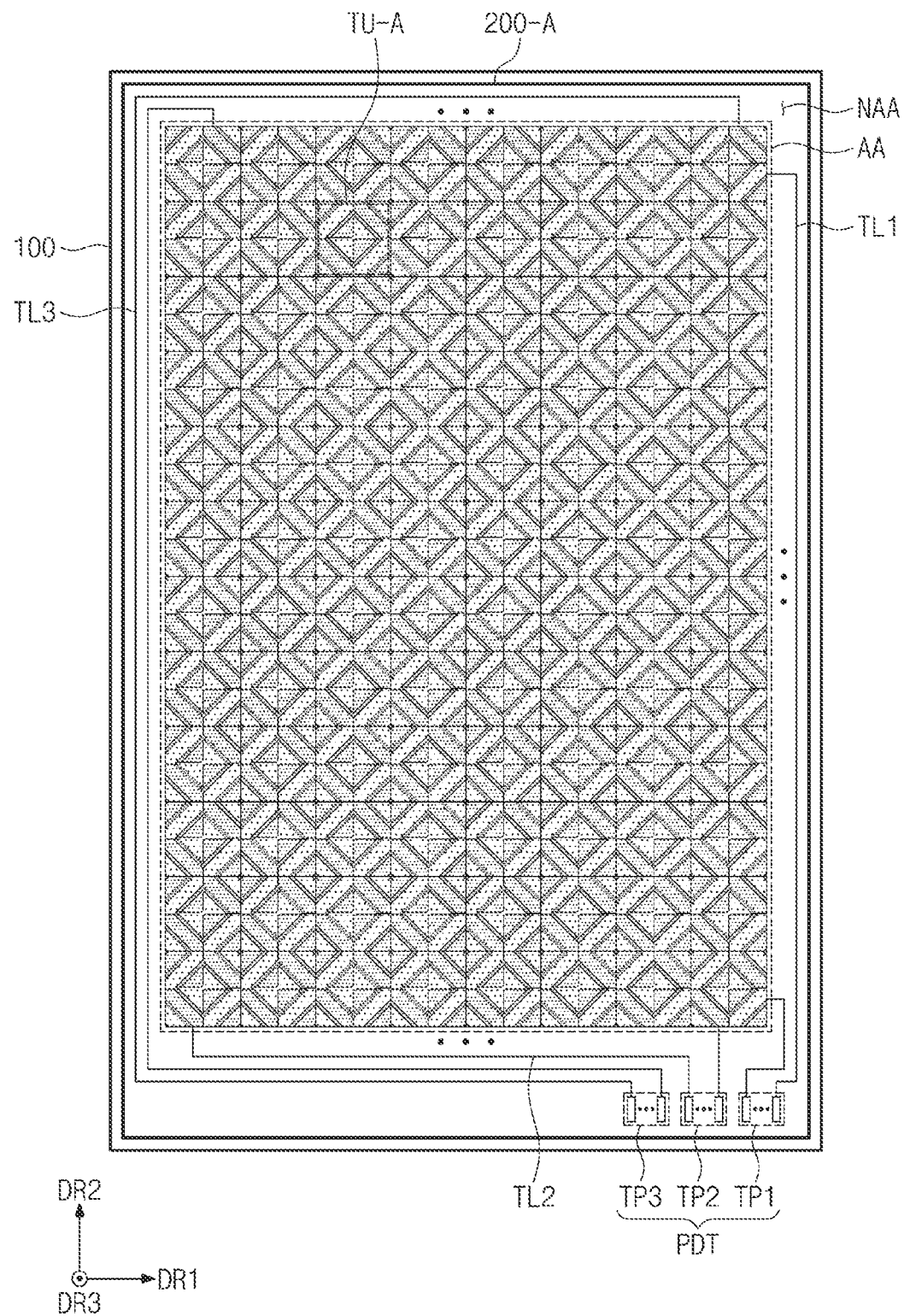
FIG. 9 is a plan view showing a sensor layer according to an embodiment of the present disclosure.
Figure 10:
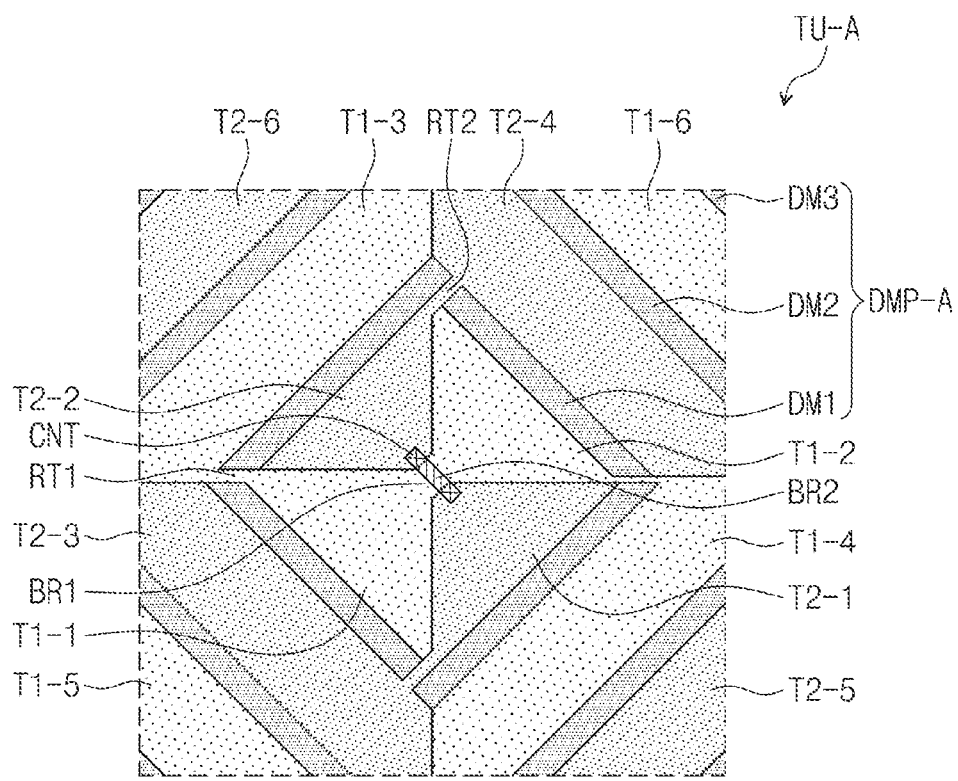
FIG. 10 is a plan view showing one sensing area according to an embodiment of the present disclosure.
Figure 10:
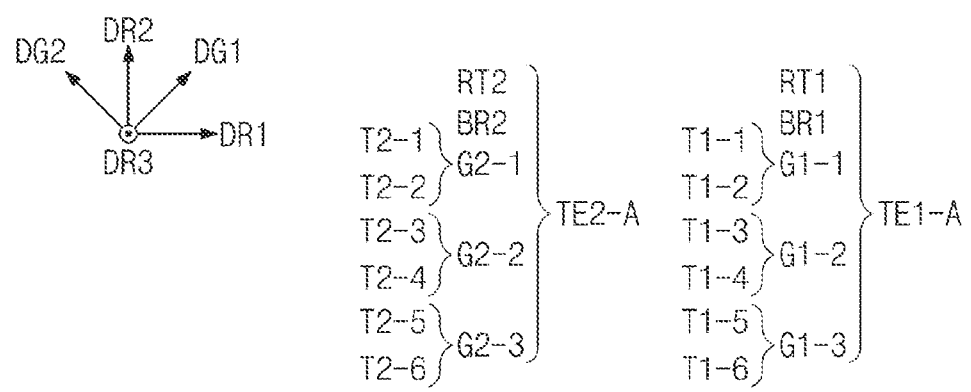

FIG. 9 is a plan view showing a sensor layer 200-A according to an embodiment of the present disclosure, and FIG. 10 is a plan view showing one sensing area according to an embodiment of the present disclosure. In FIGS. 9 and 10, the same/similar reference numerals denote the same/similar elements in FIGS. 1, 2, 3, 4, 5, 6, 7, and 8, and thus, detailed descriptions of the same/similar elements will be omitted.

Referring to FIGS. 9 and 10, the sensor layer 200-A may include sensing patterns TE1-A and TE2-A, sensing lines TL1, TL2, and TL3, and sensing pads PDT, which are disposed on a display layer 100. The sensing patterns TE1-A and TE2-A may be disposed in an active area AA, and the sensing lines TL1, TL2, and TL3 and the sensing pads PDT may be disposed in a peripheral area NAA. The active area AA may be defined as an area in which an external input or an active penis sensed.

In the present embodiment, a first sensing pattern TE1-A disposed in a sensing unit TU-A may include a first-first pattern T1-1, a first-second pattern T1-2, a first-third pattern T1-3, a first-fourth pattern T1-4, a first-fifth pattern T1-5, a first-sixth pattern T1-6, a first bridge pattern BR1, and a first extension pattern RT1.

The first-first pattern T1-1 and the first-second pattern T1-2 may be defined as a first-first group G1-1, and the first-third pattern T1-3 and the first-fourth pattern T1-4 may be defined as a first-second group G1-2. The first-fifth pattern T1-5 and the first-sixth pattern T1-6 may be defined as a first-third group G1-3.

In the present embodiment, a second sensing pattern TE2-A disposed in the sensing unit TU-A may include a second-first pattern T2-1, a second-second pattern T2-2, a second-third pattern T2-3, a second-fourth pattern T2-4, a second-fifth pattern T2-5, a second-sixth pattern T2-6, a second bridge pattern BR2, and a second extension pattern RT2.

The second-first pattern T2-1 and the second-second pattern T2-2 may be defined as a second-first group G2-1, and the second-third pattern T2-3 and the second-fourth pattern T2-4 may be defined as a second-second group G2-2. The second-fifth pattern T2-5 and the second-sixth pattern T2-6 may be defined as a second-third group G2-3.

The first-first group G1-1, the first-second group G1-2, the second-first group G2-1, and the second-second group G2-2 according to the present embodiment may correspond to the first-first group G1-1, the first-second group G1-2, the second-first group G2-1, and the second-second group G2-2 described with reference to FIGS. 7 and 8. In addition, the bridge patterns BR1 and BR2 according to the present embodiment may correspond to the bridge patterns BR1 and BR2 described with reference to FIGS. 7 and 8.

The first-fifth pattern T1-5 and the first-sixth pattern T1-6 of the first sensing pattern TE1-A may be spaced apart from each other with respect to the first-first group G1-1, the first-second group G1-2, the second-first group G2-1, and the second-second group G2-2 interposed therebetween in a first oblique direction DG1. The first-fifth pattern T1-5 may face the second-third pattern T2-3, and the first-sixth pattern T1-6 may face the second-fourth pattern T2-4.

The second-fifth pattern T2-5 and the second-sixth pattern T2-6 of the second sensing pattern TE2-A may be spaced apart from each other with respect to the first-first group G1-1, the first-second group G1-2, the second-first group G2-1, and the second-second group G2-2 in a second oblique direction DG2. The second-fifth pattern T2-5 may face the first-fourth pattern T1-4, and the second-sixth pattern T2-6 may face the first-third pattern T1-3.

A dummy pattern DMP-A may include a first dummy pattern DM1, a second dummy pattern DM2, and a third dummy pattern DM3. Each of the first dummy pattern DM1 and the second dummy pattern DM2 may be provided in plural, may extend to the first oblique direction DG1 and the second oblique direction DG2, and may be disposed between patterns receiving different signals from each other. The third dummy pattern DM3 may be provided in plural, and the third dummy patterns DM3 may be disposed at corners of the sensing unit TU-A. That is, the first dummy pattern DM1 may be surrounded by the second dummy pattern DM2, and the second dummy pattern DM2 may be surrounded by the third dummy pattern DM3.

Figure 11:
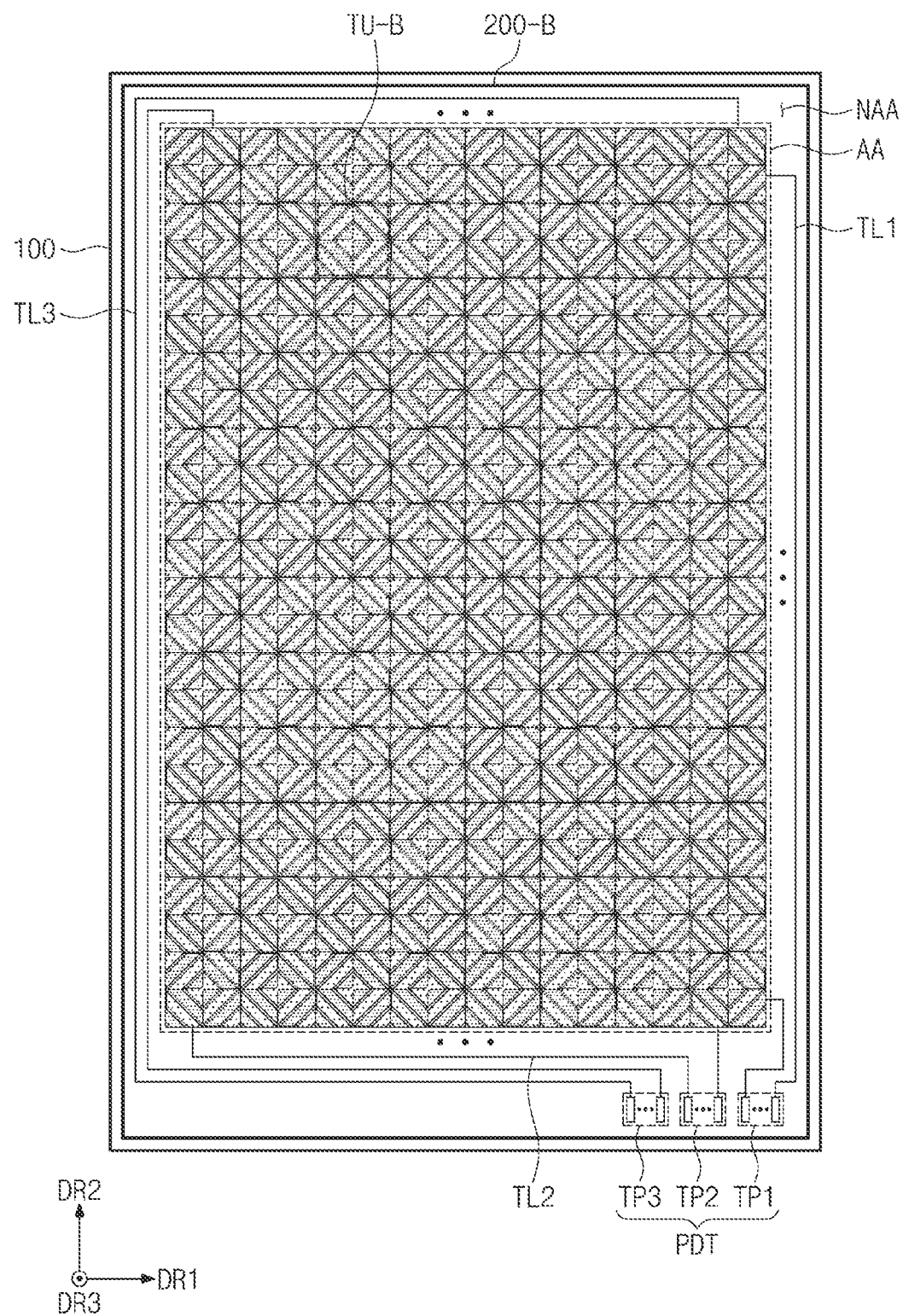
FIG. 11 is a plan view showing a sensor layer according to an embodiment of the present disclosure.
Figure 12A:
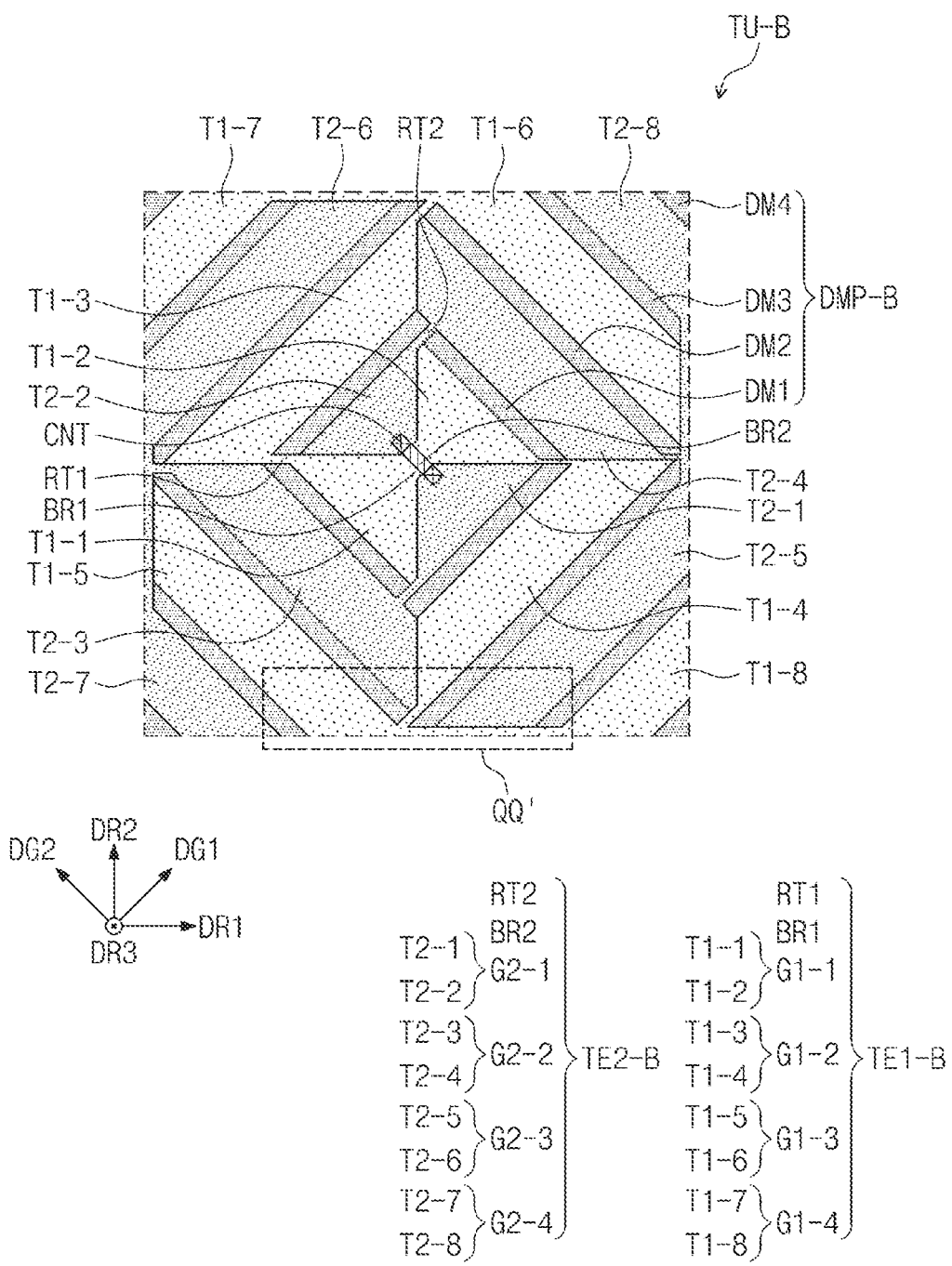
FIG. 12A is a plan view showing one sensing area according to an embodiment of the present disclosure.
Figure 12B:
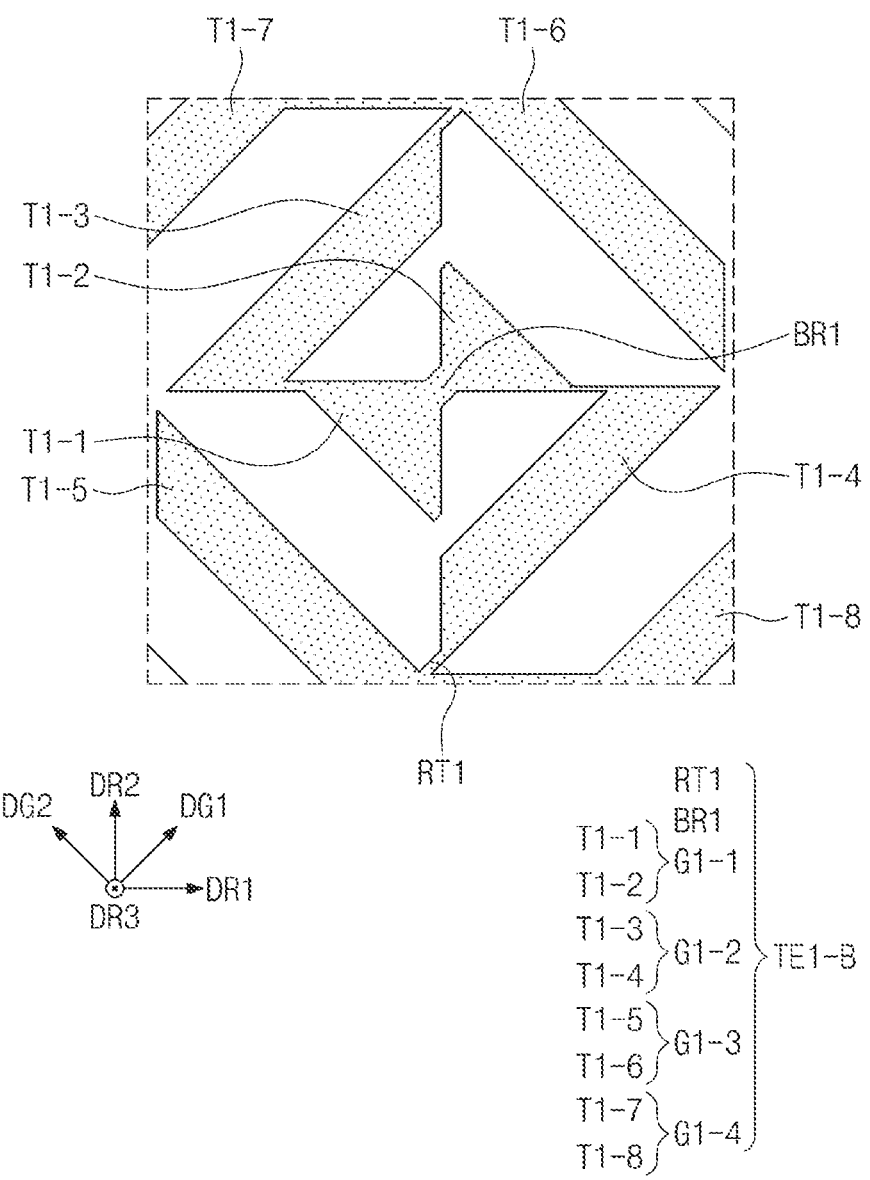
FIG. 12B is a plan view showing one sensing area according to an embodiment of the present disclosure.
Figure 12C:
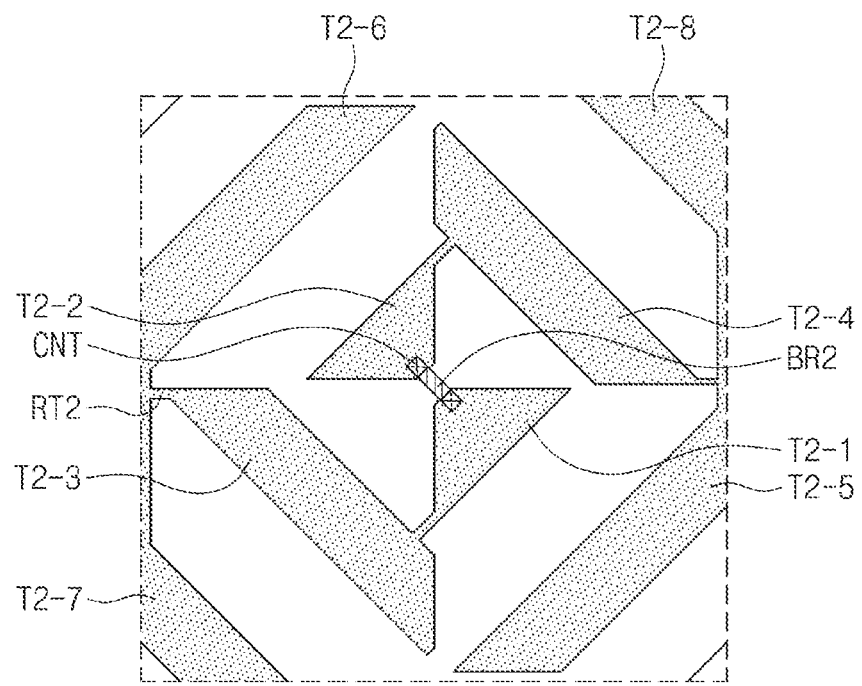
FIG. 12C is a plan view showing one sensing area according to an embodiment of the present disclosure.
Figure 12C:
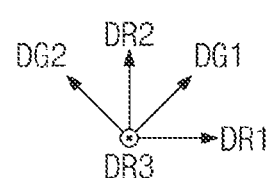
Figure 12C:
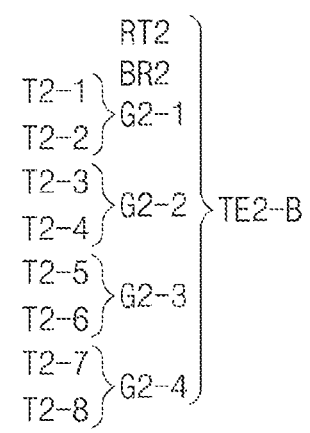
Figure 13:
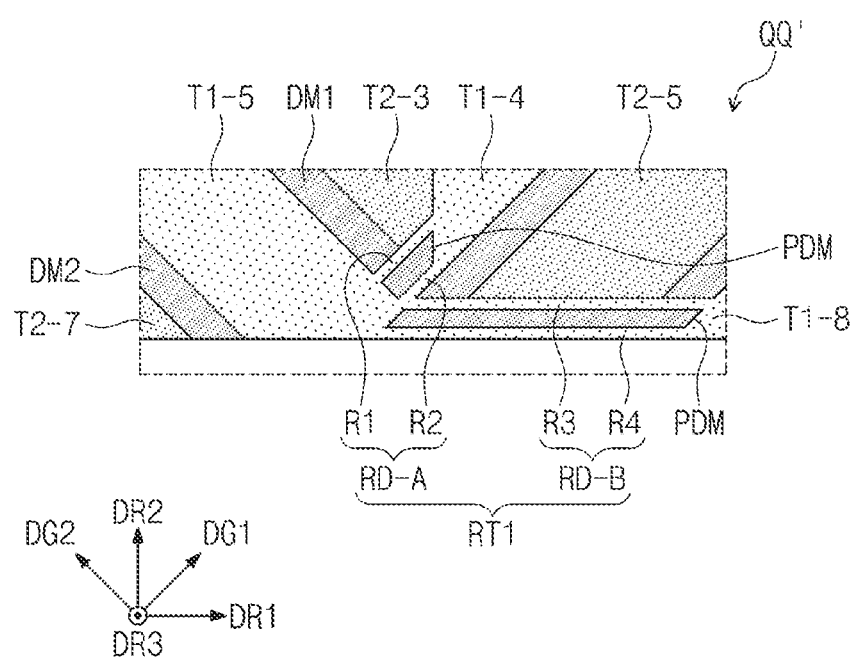
FIG. 13 is a plan view showing an area QQ' of FIG. 12A.

FIG. 11 is a plan view showing a sensor layer 200-B according to an embodiment of the present disclosure. FIG. 12A is a plan view showing one sensing area according to an embodiment of the present disclosure. FIG. 12B is a plan view showing one sensing area according to an embodiment of the present disclosure. FIG. 12C is a plan view showing one sensing area according to an embodiment of the present disclosure. FIG. 13 is a plan view showing an area QQ' of FIG. 12A.

Referring to FIGS. 11, 12A, 12B, and 12C, the sensor layer 200-B may include sensing patterns TE1-B and TE2-B, sensing lines TL1, TL2, and TL3, and sensing pads PDT, which are disposed on a display layer 100. The sensing patterns TE1-B and TE2-B may be disposed in an active area AA, and the sensing lines TL1, TL2, and TL3 and the sensing pads PDT may be disposed in a peripheral area NAA. The active area AA may be defined as an area in which an external input or an active penis sensed.

In the present embodiment, a first sensing pattern TE1-B disposed in a sensing unit TU-B may include a first-first pattern T1-1, a first-second pattern T1-2, a first-third pattern T1-3, a first-fourth pattern T1-4, a first-fifth pattern T1-5, a first-sixth pattern T1-6, a first-seventh pattern T1-7, a first-eighth pattern T1-8, a first bridge pattern BR1, and a first extension pattern RT1.

The first-first pattern T1-1 and the first-second pattern T1-2 may be defined as a first-first group G1-1, and the first-third pattern T1-3 and the first-fourth pattern T1-4 may be defined as a first-second group G1-2. The first-fifth pattern T1-5 and the first-sixth pattern T1-6 may be defined as a first-third group G1-3, and the first-seventh pattern T1-7 and the first-eighth pattern T1-8 may be defined as a first-fourth pattern G1-4.

In the present embodiment, a second sensing pattern TE2-B disposed in the sensing unit TU-B may include a second-first pattern T2-1, a second-second pattern T2-2, a second-third pattern T2-3, a second-fourth pattern T2-4, a second-fifth pattern T2-5, a second-sixth pattern T2-6, a second-seventh pattern T2-7, a second-eighth pattern T2-8, a second bridge pattern BR2, and a second extension pattern RT2.

The second-first pattern T2-1 and the second-second pattern T2-2 may be defined as a second-first group G2-1, and the second-third pattern T2-3 and the second-fourth pattern T2-4 may be defined as a second-second group G2-2. The second-fifth pattern T2-5 and the second-sixth pattern T2-6 may be defined as a second-third group G2-3, and the second-seventh pattern T2-7 and the second-eighth pattern T2-8 may be defined as a second-fourth group G2-4.

The first-first group G1-1, the first-second group G1-2, the first-third group G1-3, the second-first group G2-1, the second-second group G2-2, and the second-third group G2-3 according to the present embodiment may correspond to the first-first group G1-1, the first-second group G1-2, the first-third group G1-3, the second-first group G2-1, the second-second group G2-2, and the second-third group G2-3 described with reference to FIGS. 7 to 10. In addition, the bridge patterns BR1 and BR2 according to the present embodiment may correspond to the bridge patterns BR1 and BR2 described with reference to FIGS. 7 and 8.

Referring to FIGS. 12A and 12B, the first-seventh pattern T1-7 and the first-eighth pattern T1-8 of the first sensing pattern TE1-B may be spaced apart from each other with respect to the first-first group G1-1, the first-second group G1-2, the first-third group G1-3, the second-first group G2-1, the second-second group G2-2, and the second-third group G2-3 interposed therebetween in the second oblique direction DG2. The first-seventh pattern T1-7 may face the second-sixth pattern T2-6, and the first-eighth pattern T1-8 may face the second-fifth pattern T2-5.

The first bridge pattern BR1 may be disposed between the first-first pattern T1-1 and the first-second pattern T1-2, and the first extension pattern RT1 may be disposed between the first-first pattern T1-1 and the first-third pattern T1-3 and between first-second pattern T1-2 and the first-fourth pattern T1-4. The first extension pattern RT1 may connect the first-third pattern T1-3 to the first-sixth pattern T1-6 and the first-seventh pattern T1-7. The first extension pattern RT1 may connect the first-fourth pattern T1-4 to the first-fifth pattern T1-5 and the first-eighth pattern T1-8.

Referring to FIGS. 12A and 12C, the second-seventh pattern T2-7 and the second-eighth pattern T2-8 of the second sensing pattern TE2-B may be spaced apart from each other with respect to the first-first group G1-1, the first-second group G1-2, the first-third group G1-3, the second-first group G2-1, the second-second group G2-2, and the second-third group G2-3 interposed therebetween in the first oblique direction DG1. The second-seventh pattern T2-7 may face the first-fifth pattern T1-5, and the second-eighth pattern T2-8 may face the first-sixth pattern T1-6.

The second-first pattern T2-1 and the second-second pattern T2-2 may be connected to each other by the second bridge pattern BR2 disposed on the first sensing insulating layer 201 (refer to FIG. 4) via a contact hole CNT defined through the second sensing insulating layer 203 (refer to FIG. 4). The second bridge pattern BR2 may overlap at least a portion of the first bridge pattern BR1 when viewed in a plane.

The second extension pattern RT2 may be disposed between the second-first pattern T2-1 and the first-third pattern T2-3 and between the second-second pattern T2-2 and the second-fourth pattern T2-4. Furthermore, the second extension pattern RT2 may connect the second-third pattern T2-3 to the second-sixth pattern T2-6 and the second-seventh pattern T2-7. Still furthermore, the second extension pattern RT2 may connect the second-fourth pattern T2-4 to the second-fifth pattern T2-5 and the second-eighth pattern T2-8. Accordingly, the first-first to first-eighth patterns T1-1, T1-2, T1-3, T1-4, T1-5, T1-6, T1-7, and T1-8 and the second-first to second-eighth patterns T2-1, T2-2, T2-3, T2-4, T2-5, T2-6, T2-7, and T2-8 may be spaced apart from each other, and even though the first-first to first-eighth patterns T1-1, T1-2, T1-3, T1-4, T1-5, T1-6, T1-7, and T1-8 and the second-first to second-eighth patterns T2-1, T2-2, T2-3, T2-4, T2-5, T2-6, T2-7, and T2-8 are arranged in a clockwise direction, the first-first to first-eighth patterns T1-1, T1-2, T1-3, T1-4, T1-5, T1-6, T1-7, and T1-8 and the second-first to second-eighth patterns T2-1, T2-2, T2-3, T2-4, T2-5, T2-6, T2-7, and T2-8 may be disposed on the same layer, e.g., the second sensing insulating layer 203 (refer to FIG. 4), in one sensing unit TU. Accordingly, other than the contact hole CNT used to connect the second bridge pattern BR2 and the second-first group G2-1, a process of forming a separate contact hole to connect sensing patterns TE1-B and TE2-B may be omitted, and thus, process cost and time may be reduced.

In the present embodiment, the first-third pattern T1-3, the first-fourth pattern T1-4, the second-fifth pattern T2-5, and the second-sixth pattern T2-6 may extend in the first oblique direction DG1, and the second-third pattern T2-3, the second-fourth pattern T2-4, the first-fifth pattern T1-5, and the first-sixth pattern T1-6 may extend in the second oblique direction DG2.

Referring to FIG. 13, the first extension pattern RT1 may be provided in plural. FIG. 13 shows the first extension pattern RT1, however, the embodiment described with reference to FIG. 13 may be applied to the second extension pattern RT2.

The first extension pattern RT1 may include an oblique pattern RD-A and a straight pattern RD-B. The oblique pattern RD-A may include a first oblique line R1 and a second oblique line R2, which extend in the first oblique direction DG1. The first oblique line R1 and the second oblique line R2 may be spaced apart from each other with a floating dummy pattern PDM interposed therebetween. The oblique pattern RD-A may connect patterns spaced apart from each other in the first oblique direction DG1 as shown in FIG. 12A.

The straight pattern RD-B may include a first straight line R3 and a second straight line R4, which extend in the first direction DR1. The first straight line R3 and the second straight line R4 may be spaced apart from each other with the floating dummy pattern PDM interposed therebetween. The straight pattern RD-B may connect patterns spaced apart from each other in the first direction DR1 as shown in FIG. 12A.

According to the present embodiment, as the pattern connecting the patterns spaced apart from each other is provided in plural, the patterns adjacent to each other may be easily connected to each other by the other lines even though one line is disconnected. Accordingly, a reliability of the sensor layer 200-B may be improved.

Figure 14:
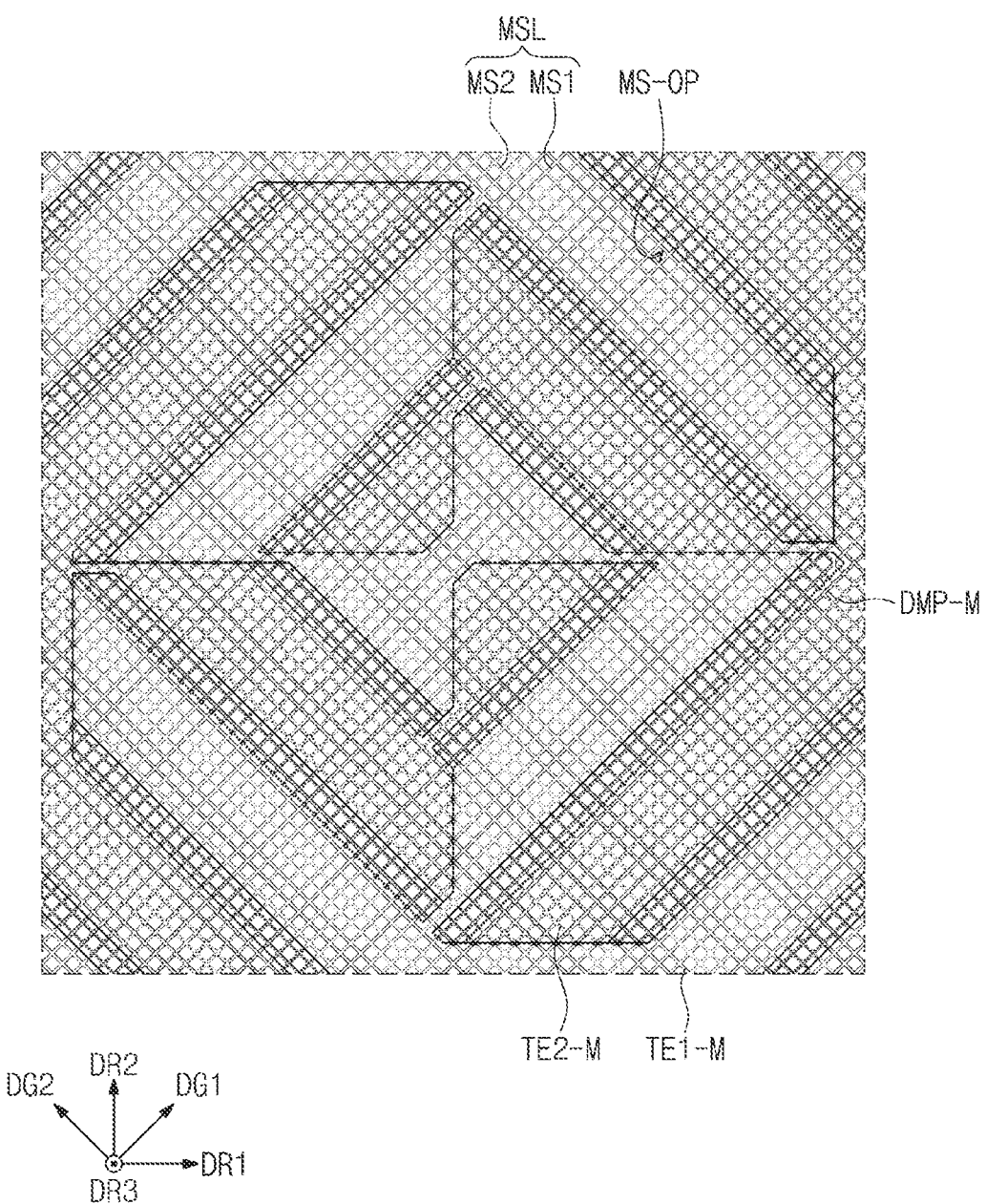
FIG. 14 is a plan view showing one sensing area according to an embodiment of the present disclosure.

FIG. 14 is a plan view showing one sensing area according to an embodiment of the present disclosure. In FIG. 14, the same/similar reference numerals denote the same/similar elements in FIGS. 1, 2, 3, 4, 5, 6, 7, 8, 9, 10, 11, 12A, 12B, 12C, and 13, and thus, detailed descriptions of the same/similar elements will be omitted.

Referring to FIG. 14, each of sensing patterns TE1-M and TE2-M and a dummy pattern DMP-M may be provided as a mesh line MSL. The mesh line MSL may include a first mesh line MS1 extending in the first oblique direction DG1 and a second mesh line MS2 extending in the second oblique direction DG2.

The first mesh line MS1 and the second mesh line MS2 may be provided in plural and may be connected to each other to define a mesh opening MS-OP. The first mesh line MS1 and the second mesh line MS2 may be disposed on the second sensing insulating layer 203 described with reference to FIG. 4 to overlap the non-light-emitting area NPXA, and the mesh opening MS-OP may be defined to overlap the light emitting area PXA.

According to the present embodiment, the light generated by the light emitting element 100PE (refer to FIG. 4) may be provided to the user after passing through the mesh opening MS-OP without being interfered with the first mesh line MS1 and the second mesh line MS2. Accordingly, a light loss of the electronic device 1000 may be reduced.

Figure 15A:
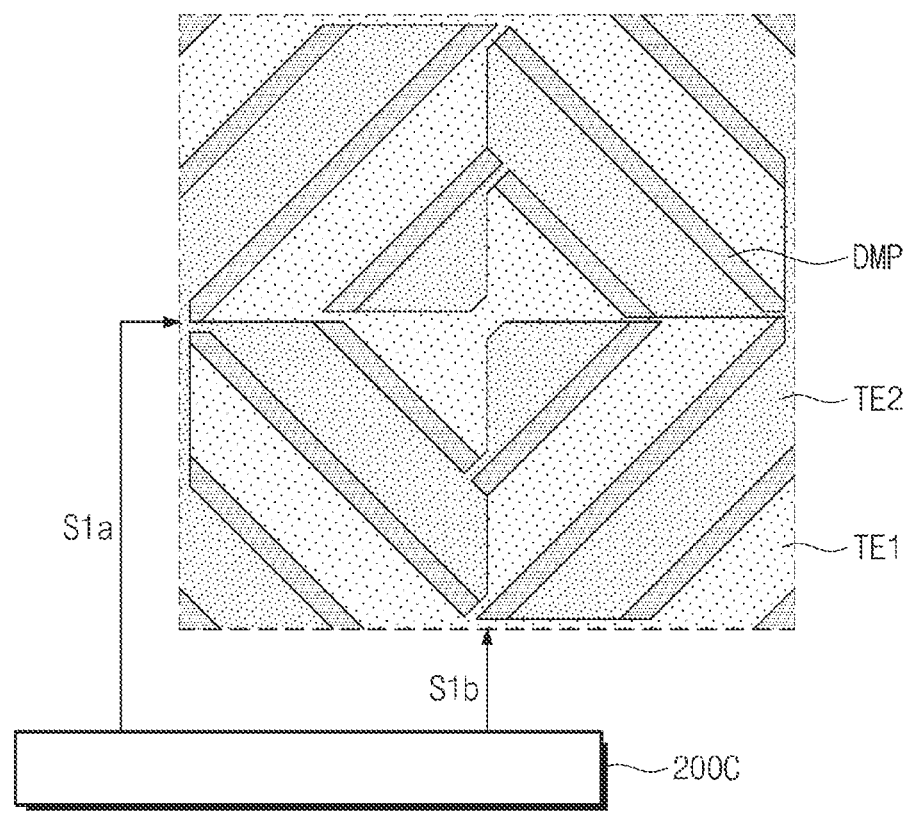
FIGS. 15A and 15B are views showing a sensor layer operated in a first mode according to an embodiment of the present disclosure.
Figure 15B:
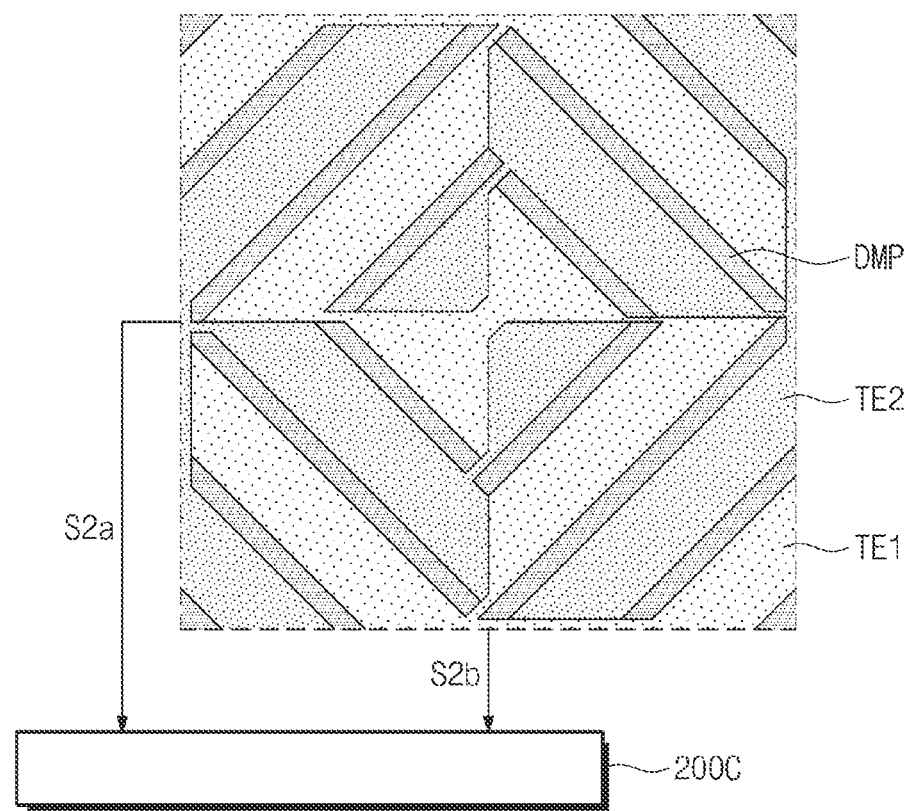
Figure 16:
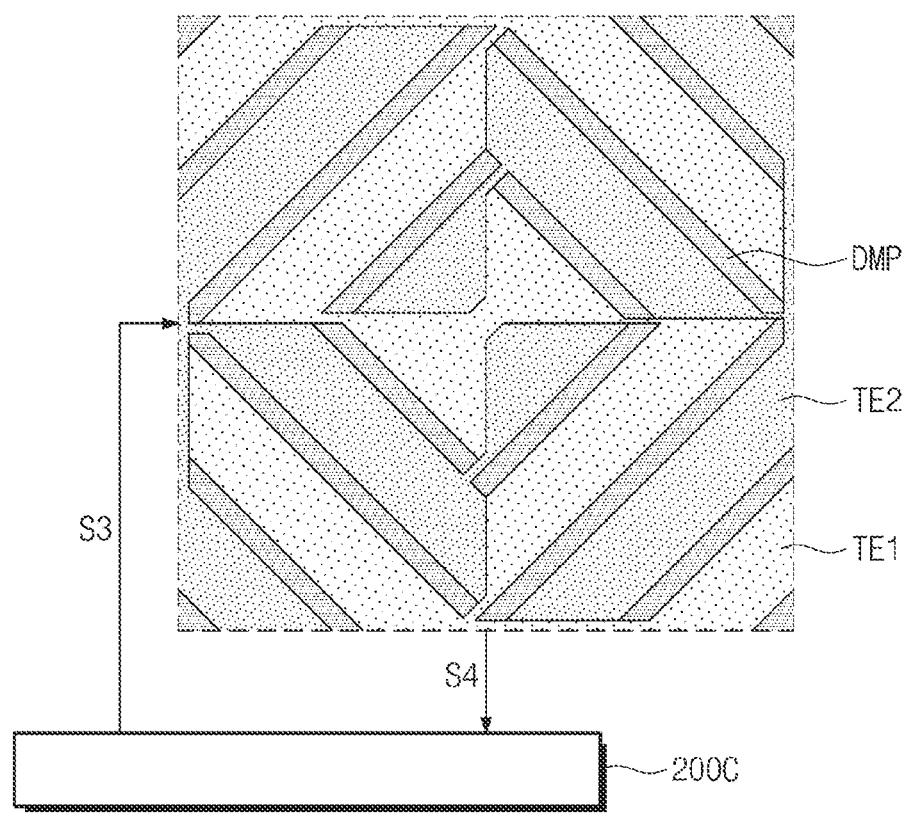
FIG. 16 is a view showing a sensor layer operated in a second mode according to an embodiment of the present disclosure.

FIGS. 15A and 15B are views showing a sensor layer operated in a first mode according to an embodiment of the present disclosure, and FIG. 16 is a view showing a sensor layer operated in a second mode according to an embodiment of the present disclosure. In FIGS. 15A, 15B, and 16, the same/similar reference numerals denote the same/similar elements in FIGS. 1, 2, 3, 4, 5, 6, 7, and 8, and thus, detailed descriptions of the same/similar elements will be omitted.

Referring to FIGS. 15A and 15B, the first mode may be a mode in which the electronic device 1000 (refer to FIG. 1) and the input device 2000 (refer to FIG. 1) transmit and receive data to and from each other. The operation shown in FIG. 15A may be an operation in which an uplink signal is provided to the input device 2000 (refer to FIG. 1) from the electronic device 1000 (refer to FIG. 1). The operation shown in FIG. 15B may be an operation in which a downlink signal is provided to the electronic device 1000 (refer to FIG. 1) from the input device 2000 (refer to FIG. 1).

Referring to FIG. 15A, each of a first sensing pattern TE1 and a second sensing pattern TE2 may serve as a transmission electrode to provide uplink signals S1a and S1b provided from a sensor driver 200C to the input device 2000 (refer to FIG. 1). In FIG. 15A, both the first sensing pattern TE1 and the second sensing pattern TE2 are used as the transmission electrode, however, they should not be particularly limited. As an example, either the first sensing pattern TE1 or the second sensing pattern TE2 may be used as the transmission electrode.

Referring to FIG. 15B, each of the first sensing pattern TE1 and the second sensing pattern TE2 may serve as a reception electrode to transmit sensing signals S2a and S2b induced by the input device 2000 (refer to FIG. 1) to the sensor driver 200C. The sensor driver 200C may receive a first sensing signal S2a from the first sensing pattern TE1 and a second sensing signal S2b from the second sensing pattern TE2.

Referring to FIG. 16, the sensor driver 200C may sense a second input generated by the touch 3000 (refer to FIG. 2) in the second mode. The sensor driver 200C may sense a variation in mutual capacitance formed between the first sensing pattern TE1 and the second sensing pattern TE2 to sense the external input in the second mode.

The sensor driver 200C may apply an output signal S3 to the first sensing pattern TE1, and the sensor driver 200C may receive a sensing signal S4 from the second sensing pattern TE2. That is, during the second mode, the first sensing pattern TE1 may serve as the transmission electrode, and the second sensing pattern TE2 may serve as the reception electrode, however, they should not be particularly limited. According to an embodiment, the first sensing pattern TE1 may serve as the reception electrode, and the second sensing pattern TE2 may serve as the transmission electrode.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present disclosure shall be determined according to the attached claims.

What is claimed is:
1. An electronic device comprising:
a display layer; and
a sensor layer disposed on the display layer and comprising a first sensing pattern and a second sensing pattern spaced apart from the first sensing pattern, the first sensing pattern including:
a first-first group having a first-first pattern and a first-second pattern spaced apart from the first-first pattern in a first oblique direction;
a first-second group having a first-third pattern and a first-fourth pattern spaced apart from the first-third pattern with respect to the first-first group interposed therebetween in a second oblique direction crossing the first oblique direction, and the second sensing pattern including:
a second-first group adjacent to the first-first group and having a second-first pattern and a second-second pattern spaced apart from the second-first pattern in the second oblique direction; and a second-second group having a second-third pattern and a second-fourth pattern spaced apart from the second-third pattern with respect to the second-first group interposed therebetween in the first oblique direction.

2. The electronic device of claim 1, wherein the first sensing pattern includes a first-third group having a first-fifth pattern and a first-sixth pattern spaced apart from the first-fifth pattern with respect to the second-second group interposed therebetween in the first oblique direction, and the second sensing pattern includes a second-third group comprising a second-fifth pattern and a second-sixth pattern spaced apart from the second-fifth pattern with respect to the first-second group interposed therebetween in the second oblique direction.

3. The electronic device of claim 2, wherein the first sensing pattern includes a first-fourth group having a first-seventh pattern and a first-eighth pattern spaced apart from the first-seventh pattern with respect to the second-third group interposed therebetween in the second oblique direction, and the second sensing pattern includes a second-fourth group having a second-seventh pattern and a second-eighth pattern spaced apart from the second-seventh pattern with respect to the first-third group interposed therebetween in the first oblique direction.

4. The electronic device of claim 2, wherein the first-third pattern, the first-fourth pattern, the second-fifth pattern, and the second-sixth pattern extend in the first oblique direction, and the second-third pattern, the second-fourth pattern, the first-fifth pattern, and the first-sixth pattern extend in the second oblique direction.

5. The electronic device of claim 3, further comprising extension patterns disposed between patterns of the first sensing pattern and between patterns of the second sensing pattern.

6. The electronic device of claim 5, wherein the extension patterns of the first sensing pattern are alternately arranged with and spaced apart from the extension patterns of the second sensing pattern along a clockwise direction.

7. The electronic device of claim 5, further comprising a dummy pattern disposed between the patterns of the first sensing pattern and between the patterns of the second sensing pattern.

8. The electronic device of claim 1, wherein the first sensing pattern includes a first bridge pattern disposed between the first-first pattern and the first-second pattern and integrally formed with the first-first pattern and the first-second pattern.

9. The electronic device of claim 8, wherein the second sensing pattern includes a second bridge pattern disposed between the second-first pattern and the second-second pattern and disposed on a layer different from a layer on which the first bridge pattern is disposed.

10. The electronic device of claim 9, wherein the sensor layer includes:
a first sensing insulating layer disposed on the display layer;
a first conductive layer disposed on the first sensing insulating layer and disposed in a the non-light-emitting area;
a second sensing insulating layer disposed on the first sensing insulating layer and covering the first conductive layer; and
a second conductive layer disposed on the second sensing insulating layer and disposed in the non-light-emitting area, the first conductive layer includes the second bridge pattern, and the second conductive layer includes the other patterns except the second bridge pattern among the first sensing pattern and the second sensing pattern.

11. The electronic device of claim 10, wherein the second bridge pattern is connected to the second-first pattern and the second-second pattern via contact holes defined through the second sensing insulating layer.

12. The electronic device of claim 1, wherein the first sensing pattern and the second sensing pattern include a plurality of mesh lines extending in the first and second oblique directions and defining a mesh opening.

13. The electronic device of claim 1, wherein each of the first-first pattern, the first-second pattern, the second-first pattern, and the second-second pattern has an area smaller than combined areas of the first-second group and the second-second group.

14. The electronic device of claim 1, wherein an area in which the first-first group and the second-first group are disposed has a lozenge shape, and the first-second group and the second-second group surround the lozenge shape.

15. The electronic device of claim 14, wherein the first-first pattern, the second-second pattern, the first-second pattern, and the second-first pattern are sequentially arranged in a clockwise direction, the first-third pattern faces the second-second pattern, the first-fourth pattern faces the second-first pattern, the second-third pattern faces the first-first pattern, and the second-fourth pattern faces the first-second pattern.

16. The electronic device of claim 1, wherein the display layer includes:
a base layer;
a circuit layer disposed on the base layer and having a transistor;
a light emitting element layer having a light emitting element connected to the transistor; and
an encapsulation layer covering the light emitting element, and the sensor layer is disposed on the encapsulation layer.

17. The electronic device of claim 1, wherein the display layer includes:
a base layer;
a circuit layer disposed on the base layer and having a transistor;
a light emitting element layer having a light emitting element connected to the transistor;
an encapsulation substrate disposed on the light emitting element layer; and
a coupling member disposed at an edge of the encapsulation substrate to attach the circuit layer to the encapsulation substrate, and the sensor layer is disposed on the encapsulation substrate.

18. An electronic device comprising:
a first-first group having a first-first pattern and a first-second pattern spaced apart from the first-first pattern in a first oblique direction;
a first-second group having a first-third pattern and a first-fourth pattern spaced apart from the first-third pattern with the first-first group interposed therebetween in a second oblique direction crossing the first oblique direction;
a second-first group having a second-first pattern and a second-second pattern spaced apart from the second-first pattern in the second oblique direction; and
a second-second group having a second-third pattern and a second-fourth pattern spaced apart from the second-third pattern in the first oblique direction, wherein the first-first pattern, the second-second pattern, the first-second pattern, and the second-first pattern are sequentially arranged in a clockwise direction, the first-third pattern faces the second-second pattern, the first-fourth pattern faces the second-first pattern, the second-third pattern faces the first-first pattern, and the second-fourth pattern faces the first-second pattern.

19. The electronic device of claim 18, further comprising extension patterns disposed between patterns of the first sensing pattern and between patterns of the second sensing pattern.

20. The electronic device of claim 18, further comprising a dummy pattern disposed between the patterns of the first sensing pattern and between the patterns of the second sensing pattern.

* * * * *